(12) United States Patent
Yu et al.

(10) Patent No.: US 7,587,019 B2
(45) Date of Patent: Sep. 8, 2009

(54) CONFIGURATION AND CONTROLLING METHOD OF FRACTIONAL-N PLL HAVING FRACTIONAL FREQUENCY DIVIDER

(75) Inventors: Shih-An Yu, Taipei (TW); Yu-Che Yang, Sansing Shang (TW); Shey-shi Lu, Taipei (TW)

(73) Assignees: Memetics Technology Co., Ltd., Taipei (TW); National Taiwan University, Taipei (TW)

( * ) Notice: Subject to any disclaimer, the term of this patent is extended or adjusted under 35 U.S.C. 154(b) by 183 days.

(21) Appl. No.: 11/590,482

(22) Filed: Oct. 30, 2006

(65) Prior Publication Data

US 2007/0147571 A1    Jun. 28, 2007

(30) Foreign Application Priority Data

Dec. 27, 2005    (TW) ............................... 94146864 A

(51) Int. Cl.
*H03K 21/00*    (2006.01)
*H03K 23/00*    (2006.01)

(52) U.S. Cl. ......................................... 377/47; 377/48
(58) Field of Classification Search ....................... None
See application file for complete search history.

(56) References Cited

U.S. PATENT DOCUMENTS

| | | | |
|---|---|---|---|
| 5,172,400 A * | 12/1992 | Maemura | 377/116 |
| 5,349,622 A * | 9/1994 | Gorisse | 377/52 |
| 5,859,890 A * | 1/1999 | Shurboff et al. | 377/48 |
| 6,411,669 B1 * | 6/2002 | Kim | 377/48 |
| 6,501,816 B1 * | 12/2002 | Kouznetsov et al. | 377/48 |
| 6,614,274 B1 * | 9/2003 | Shi et al. | 327/115 |
| 6,861,881 B1 * | 3/2005 | Neravetla et al. | 327/115 |
| 7,042,257 B2 * | 5/2006 | Wang | 327/115 |

OTHER PUBLICATIONS

Yu-Che Yang, Shih-An Yu, Tao Wang, and Shey-Shi Lu, "A Dual-Mode Truly Modular Programmable Fractional Divider Based on a 1/1.5 Divider Cell", IEEE Microwave and Wireless Components Letters, vol. 15, No. 11, Nov. 2005, pp. 754-756.

* cited by examiner

*Primary Examiner*—Tuan Lam
(74) *Attorney, Agent, or Firm*—Volpe and Koenig, P.C.

(57) ABSTRACT

The provided fractional frequency divider includes a divider controlling unit for generating a divider selection signal in response to a dual-edge triggering of an input signal and a frequency dividing unit coupled to the divider controlling unit for dividing the frequency of the input signal by one of an integer and a fractional dividers in response to the dual-edge triggering and the divider selection signal to generate the output signal of the fractional frequency divider. An operation of the frequency dividing unit is not suppressed when the integer divider is employed, the operation of the frequency dividing unit is not suppressed for a period of the input signal and is suppressed for half of that period, and this cycle is kept on recurring when the fractional divider is employed. The fractional-n PLL having the fractional frequency divider is also provided.

9 Claims, 17 Drawing Sheets

CONFIGURATION AND CONTROLLING METHOD OF FRACTIONAL-N PLL HAVING FRACTIONAL FREQUENCY DIVIDER

FIELD OF THE INVENTION

The present invention relates to the configurations and the controlling methods of a fractional frequency divider (FFD), a programmable fractional frequency divider (PFFD) and a Fractional-N phase locked loop (FNPLL) respectively. More particularly, the present invention relates to the configurations and the controlling methods of the FFD having an integer modulus and a fractional modulus, the PFFD having an adjustable modulus range (AMR) and the FNPLL having the AMR respectively.

BACKGROUND OF THE INVENTION

Please refer to FIG. 1, which is the block diagram of a conventional PLL frequency synthesizer. The conventional PLL frequency synthesizer 2 employs an external crystal oscillator (XO, e.g., a temperature compensated crystal oscillator: TCXO) 21 to generate an accurate reference signal, an on chip voltage controlled oscillator (VCO) 25 to generate a signal, a frequency divider 26 to divide the frequency of the signal by N, a phase frequency detector (PFD) 22 to compare the frequency divided signal with the reference signal, a charge pump (CP) 23 and a loop filter (LPF) 24 to adjust the oscillating frequency of the VCO 25. Due to the negative feedback scheme of the conventional PLL frequency synthesizer 2, the frequency of the output signal of the VCO $F_{VCO}$ will be stabilized at a product of an integer, N, and the frequency of the reference signal $F_{TCXO}$. That is, $$F_{VCO} = N \cdot F_{TCXO} \tag{1}$$

After the conventional phase locked loop (PLL) frequency synthesizer 2 locks the frequency of the output signal of the VCO 25, the jitter of the output signal of the VCO 25 will be decreased dramatically, and the phase noise within the frequency bandwidth of the PLL is suppressed, which could be observed from the frequency spectrum of the output signal of the VCO 25.

Since the frequency of the output signal of the conventional PLL frequency synthesizer 2 is an integer multiple, N, of the frequency of the reference signal, the configuration such as that of FIG. 1 is called the Integer-N PLL. There are many inconveniences regarding the design of the Integer-N PLL due to the unique feature that the frequency of the output signal is the integer multiples of the frequency of the reference signal. The frequency of the reference signal must be one of the same as the bandwidth and a factor of the bandwidth, and the locked time of the frequency is indirectly influenced by that (due to the consideration of stability, the loop bandwidth has to be less or equal to 1/10 of the frequency of the reference signal).

To solve this problem, another kind of PLL is developed, and is referred to as the Fractional-N PLL. In FIG. 2, the block diagram of a conventional Fractional-N PLL frequency synthesizer 3 is shown. The conventional Fractional-N PLL frequency synthesizer 3 further includes a PFFD 31, a modulator 32 and an adder 33 except for the components 21-25 of FIG. 1. An external integer modulus is employed, added with the output signal of the modulator, and the result thereof is input to the PFFD 31 to generate a modulus. The unique feature of this kind of Fractional-N PLL frequency synthesizer is that the output frequency of the VCO 25 is not an integer multiple of the reference signal anymore. That is, $$F_{VCO} = N \cdot F \cdot F_{TCXO} \tag{2}$$

In which, N is an integer, and F is a fraction that is less than one. The configuration of this kind of Fractional-N PLL frequency synthesizer 3 is different from that of the aforementioned Integer-N PLL frequency synthesizer 2 mainly because that an extra modulator 32 is included as shown in FIG. 2. In the process of phase locking, the modulator 32 will change the value of the modulus of the PFFD 31, and the average value of this modulus will be a predetermined non-integer value.

For example, if the modulus value of the PFFD 31 is set at 100 in four continuous time periods, and the modulus value of the PFFD 31 is set at 101 in another six continuous time periods, then the modulus value is equivalent to 100.6.

There are certain drawbacks regarding employing the configuration of this kind of Fractional-N PLL frequency synthesizer 3. From the above-mentioned descriptions, one could easily find that the modulus of the PFFD 31 is still an integer, but the continuous switching makes the modulus looks like a fraction. Thus, there are certain quantization errors in each of the output period. Using the aforementioned example to explain, the quantization error is 0.6 when the modulus is 100, the quantization error is 0.4 when the modulus is 101, these errors would make the Fractional-N PLL frequency synthesizer 3 generate extra phase noises and certain spurs, and someone provides a relatively more complex configuration of the modulator 32, e.g., a delta-sigma modulator (DSM), to make the module of the modulated signal randomized, which will move the energy of the quantization error to a place having a relatively higher frequency, and decrease the phase noises in the loop bandwidth. However, the problem raised before could not be solved since the PFFD 31 is an intrinsic integer frequency divider.

The function of the aforementioned PFFD 31 is to decrease the frequency of the output signal of the VCO 25 so as to compare with and to approach the frequency of the reference signal, and the principle of which is mainly based on counting the input signal to generate the output signal having a time period which is an integer multiple of the time period of the input signal.

FIG. 3 is the schematic circuit diagram of a conventional PFFD 31. In which, the PFFD 31 includes a plurality of 2/3 frequency dividers 311 electrically connected to each other in series and each having the integer moduli 2/3. The schematic circuit diagram of a conventional 2/3 frequency divider 311 is shown in FIG. 4. The 2/3 frequency divider 311 includes mainly two parts: the prescaler logic 3111 and the end-of-cycle logic 3112. The prescaler logic 3111 includes a first AND Gate 31111, a first latch 31112 and a second latch 31113 for processing the input signal, and the end-of-cycle logic 3112 includes a second AND Gate 31121, a third latch 31122, a third AND Gate 31123 and a fourth latch 31124 for determining the modulus of the frequency divider 311 according to the two modulus control signals MOD and FB_CTRL. Referring to FIG. 4, the feedback signal of the end-of-cycle logic 3112 will be maintained at logic 1 when one of the MOD and FB_CTRL is logic 0, the prescaler logic 3111 will not be influenced by that, the modulus is two, and the frequency of the input signal is divided by two. The feedback signal of the end-of-cycle logic 3112 will be maintained at logic 1 when both of the MOD and FB_CTRL are logic 1 such that the end-of-cycle logic 3112 will suppress the operation of the prescaler logic 3111 by one time period of the input signal, that is to say the frequency of the input signal is divided by three, and the modulus is three.

Please refer to FIG. 3 again, the 2/3 frequency divider 311 will divide the frequency of the input signal ($F_{IN}/F_{OUT1}/\ldots F_{OUTN}$) by three only when both of the MOD ($MOD_0/MOD_1/\ldots MOD_N$) and the FB_CTRL ($FB\_CTRL_1/FB\_CTRL_2 \ldots /FB\_CTRL_{N+1}$) of the same stage are logic 1. For each of the plurality of 2/3 frequency dividers 311 electrically connected to each other in series, the FB_CTRL is the $CTRL_{OUT}$ signal (as shown in FIG. 4) from the next stage, the FB_CTRL of the last stage of the plurality of 2/3 frequency dividers 311 is directly connected to logic 1, and the feedback signal of which will be changed from logic 0 to logic 1 each time when the output signal of the last stage of the plurality of 2/3 frequency dividers 311 is logic 1; if the MOD of the previous stage ($MOD_{N-1}$) is logic 1, the modulus of the previous stage (N) will be 3, otherwise, the modulus of the previous stage (N) will be 2; but no matter what value the $MOD_{N-1}$ is, the feedback signal of the last stage will also become logic 1 so as to control the modulus of the previous stage (N). Thus, the modulus of the whole plurality of 2/3 frequency dividers 311 electrically connected to each other in series can be derived accordingly as follow:

$$T_{OUT} = (2^{N+1} + 2^N \cdot MOD_N + \ldots + 2^2 \cdot MOD_2 + 2 \cdot MOD_1 + MOD_0) \cdot T_{IN} \quad (3)$$

In which, $T_{OUT}$ is the time period of the output signal $F_{OUT}$, and $T_{IN}$ is the time period of the input signal $F_{IN}$. From the above-mentioned formula, two main drawbacks are: (1) the modulus range is limited within $2^{N+1}$ to $2^{N+2}-1$ and (2) the adjustable step size is 1.

Keeping the drawbacks of the prior arts in mind, and employing experiments and research full-heartily and persistently, the configuration and the controlling method of the Fractional-N PLL having the fractional frequency divider are finally conceived by the applicants.

SUMMARY OF THE INVENTION

It is therefore an object of the present invention to provide the configurations and the controlling methods of an FFD, a PFFD, an FNPLL, a PFFD having an AMR and an FNPLL having an AMR respectively. The provided circuits have relatively better modulus resolution so as to generate lower quantization errors and lower phase noises relatively.

According to the first aspect of the present invention, an FFD includes a modulus controlling unit (MCU) generating a modulus selection signal (MSS) in response to a dual-edge triggering (DET) of an input signal and a frequency dividing unit (FDU) coupled to the MCU and dividing a frequency of the input signal by one of an integer and a fractional moduli in response to the DET and the MSS to generate an output signal.

Preferably, the DET indicates that both the MCU and the FDU are triggered by a rising edge and a falling edge of the input signal.

Preferably, the MSS is in a logic low state and an operation of the FDU is not suppressed when the FFD is in a divided-by-the integer modulus mode, the operation is suppressed when the MSS is in a logic high state, and the operation has a recurring cycle, in which the operation is not suppressed for a time period of the input signal and then suppressed for half of the time period of the input signal, when the FFD is in a divided-by-the fractional modulus mode.

Preferably, the MCU further receives a modulus control signal (MCS) and a feedback control signal (FCS), the MSS is in the logic low state when one of the MCS and the FCS is in the logic low state, and the MSS is in the logic high state when the MCS and the FCS are both in the logic high-state.

Preferably, the integer modulus is 1 and the fractional modulus is 1.5.

Preferably, the FFD further includes an input terminal receiving the input signal and an output terminal outputting the output signal, in which the FDU further includes a first NOT gate having an input and an output terminals, a first AND gate having a first terminal, a second terminal coupled to the output terminal of the first NOT gate and an output terminal, a second NOT gate having an input terminal coupled to the output terminal of the FFD and receiving a first feedback signal and an output terminal coupled to the first terminal of the first AND gate, a first latch having a first terminal coupled to the output terminal of the first AND gate, a second terminal being an enable terminal, coupled to the input terminal of the FFD and receiving the input signal and an output terminal, a second latch having a first terminal coupled to the output terminal of the first AND gate, a second terminal coupled to the input terminal of the FFD and receiving the input signal and an output terminal, and a first multiplexer having a first terminal coupled to the output terminal of the first latch, a second terminal coupled to the output terminal of the second latch, a third terminal coupled to the input terminal of the FFD and receiving the input signal and an output terminal coupled to the output terminal of the FFD.

Preferably, the MCU further includes a second AND gate having a first terminal coupled to the output terminal of the FFD and receiving a second feedback signal, a second terminal receiving the FCS and an output terminal, a third latch having a first terminal coupled to the output terminal of the second AND gate, a second terminal being an enable terminal, coupled to the input terminal of the FFD and receiving the input signal and an output terminal, a fourth latch having a first terminal coupled to the output terminal of the second AND gate, a second terminal coupled to the input terminal of the FFD and receiving the input signal and an output terminal, a second multiplexer having a first terminal coupled to the output terminal of the third latch, a second terminal coupled to the output terminal of the fourth latch, a third terminal coupled to the input terminal of the FFD and receiving the input signal and an output terminal, and a third AND gate having a first terminal coupled to the output terminal of the second multiplexer, a second terminal receiving the MCS and an output terminal coupled to the input terminal of the first NOT gate.

According to the second aspect of the present invention, an FFD includes an integer and a fractional moduli and a first and a second states and generating an output signal through dividing a frequency of an input signal, in which the frequency of the input signal is divided by the integer modulus and a generation of the output signal is not suppressed when the FFD is in the first state, and the frequency of the input signal is divided by the fractional modulus and the generation has a recurring cycle, in which the generation is not suppressed for a time period of the input signal and then suppressed for half of the time period of the input signal, when the FFD is in the second state.

Preferably, the FFD further includes a MCU generating a MSS in response to a DET of the input signal and one of the first and the second states, and a FDU coupled to the MCU and generating the output signal in response to the DET and the MSS, in which the MSS is in a logic low state when the FFD is in the first state, and the MSS has a recurring cycle, in which the MSS is in a logic low state for a time period of the input signal and then in a logic high state for half of the time period of the input signal, when the FFD is in the second state.

According to the third aspect of the present invention, a PFFD generating a first output signal through dividing a frequency of a first input signal by one of a plurality of moduli each having a fractional step size includes a FFD receiving the first input signal and dividing the frequency of the first input signal by one of a first integer and a fractional moduli in response to a first and a second states respectively so as to generate a second output signal, and a divider chain including a plurality of integer frequency dividers (IFDs), having any two neighboring ones of the plurality of IFDs coupled to each other in series, receiving the second output signal and generating the first output signal, in which each of the plurality of IFDs divides a frequency of a divider input signal by one of a second integer and a third integer moduli in response to a third and a fourth states respectively so as to generate a divider output signal.

Preferably, the FFD is employed to receive one of a plurality of modulus control signals (MCSs) and an FCS of the divider chain, and each of the plurality of the IFDs is employed to receive one of the plurality of MCSs and the FCS of each of the plurality of the IFDs.

Preferably, one of one of the plurality of MCSs received by the FFD and the FCS of the divider chain is in a logic low state when the FFD is in the first state, one of the plurality of MCSs received by the FFD and the FCS of the divider chain are both in a logic high state when the FFD is in the second state, one of the FCS of a specific one of the plurality of the IFDs and one of the plurality of MCSs received by the specific IFD is in the logic low state when the specific IFD is in the third state, and one of the plurality of MCSs received by the specific IFD and the FCS of the specific IFD are both in the logic high state when the specific IFD is in the fourth state.

Preferably, a value of one of the plurality of moduli of the PFFD is decided by setting each of the plurality of MCSs in one of the logic high and the logic low states, and the value is ranged from $2^N$ to $2^{(N+1)}-0.5$, the step size is 0.5, and (N+1) is a total number of the plurality of MCSs.

Preferably, each of the plurality of the IFDs is a 2/3 frequency divider.

Preferably, the first two stages of the FFD and the plurality of the IFDs are two SCL circuits, a remaining part of the plurality of the IFDs are CMOS logic circuits, and there is an interface circuit between the SCL circuits and the CMOS logic circuits.

Preferably, each of the two SCL circuits includes a plurality of SCL latches and a plurality of SCL multiplexers.

According to the fourth aspect of the present invention, a PFFD having an AMR, receiving an input signal, adjusting the AMR according to a modulus range controlling signal (MRCS) and generating an output signal through dividing a frequency of the input signal by one of a plurality of moduli each having a fractional step size includes a PFFD circuit dividing the frequency of the input signal by one of the plurality of moduli to generate the output signal, including a plurality of IFDs and having any two neighboring ones of the plurality of IFDs coupled to each other in series, and a modulus range control circuit (MRCC) controlling a turn-on and a turn-off of a feedback control of each of a specific one of the plurality of IFDs and all other plurality of IFDs following the specific IFD according to the MRCS so as to adjust the AMR.

Preferably, the MRCC further includes a plurality of OR gates each having a first, a second and a control terminals, in which the first and the output terminals are coupled to one of a plurality of feedback loops and each of the plurality of feedback loops is coupled between one of any two neighboring ones of the plurality of IFDs and the FFD and the plurality of IFDs, a decoder having an input terminal receiving the MRCS and a plurality of output terminals each coupled to the second terminal of one of the plurality of OR gates and outputting one of a plurality of logic low states and a logic high state and a plurality of logic low states, in which the plurality of IFDs following one of the plurality of output terminals outputs the logic high state are equivalent to be cut off and have no influence on the output signal of the PFFD, and a multiplexer having a plurality of input terminals receiving the MRCS and coupled between one of any two neighboring ones of the plurality of IFDs and the FFD and the plurality of IFDs and an output terminal outputting the output signal of the PFFD, in which the multiplexer is employed to select an input signal of one of the plurality of input terminals as the output signal of the PFFD according to the MRCS.

According to the fifth aspect of the present invention, an FNPLL includes a VCO receiving an input signal and generating an output signal, and a PFFD coupled to the VCO, receiving a feedback signal of the output signal and dividing a frequency of the feedback signal by one of a plurality of moduli having a fractional step size so as to generate a frequency divided output signal.

Preferably, a frequency of the output signal of the VCO is stabilized at a frequency of a reference signal source multiplied by a mean value of the plurality of moduli.

Preferably, the VCO further includes a first voltage controlled capacitor (FVCC) having a first terminal coupled to a LPF and adjusting an oscillating frequency of the VCO according to the input signal and a second terminal, a second voltage controlled capacitor (SVCC) having a first terminal coupled to the first terminal of the FVCC and adjusting the oscillating frequency of the VCO according to the input signal and a second terminal, a first inductor having a first terminal coupled to the second terminal of the FVCC and a second terminal coupled to a ground and forming a first resonant cavity with the FVCC, a second inductor having a first terminal coupled to the second terminal of the SVCC and a second terminal coupled to the ground and forming a second resonant cavity with the SVCC, a first capacitor array forming the first resonant cavity with the first inductor and the FVCC and including a plurality of first resonant capacitors each having a first terminal coupled to the first terminal of the first inductor and a second terminal, and a plurality of first switches each having a first terminal coupled to the second terminal of one of the plurality of first resonant capacitors and a second terminal coupled to the ground, a second capacitor array forming the second resonant cavity with the second inductor and the SVCC and including a plurality of second resonant capacitors each having a first terminal coupled to the first terminal of the second inductor and a second terminal, and a plurality of second switches each having a first terminal coupled to the second terminal of one of the plurality of second resonant capacitors and a second terminal coupled to the ground, and a core circuit coupled to the first terminals of the first and the second inductors and generating the output signal of the VCO.

Preferably, the core circuit further includes a first transistor having a first terminal coupled to the PFFD, a second terminal and a control terminal coupled to the second terminal, a second transistor having a first terminal coupled to the PFFD, a second terminal and a control terminal coupled to the control terminal of the first transistor, a first resistor having a first terminal coupled to the second terminal of the first transistor and a second terminal coupled to the ground, a third transistor having a first terminal coupled to the second terminal of the second transistor, a second terminal coupled to the first terminal of the second inductor and a control terminal coupled to the first terminal of the first inductor, and a fourth transistor having a first terminal coupled to the first terminal of the third transistor, a second terminal coupled to the first terminal of the first inductor and a control terminal coupled to the first terminal of the second inductor.

Preferably, the FNPLL further includes an XO generating a reference signal source, a PFD coupled to the XO and the PFFD, comparing a phase and a frequency of the reference signal source and the phase and the frequency of the frequency divided output signal and generating one of a charging signal and a discharging signal accordingly, a CP coupled to the PFD, generating a charging action to raise an output current so as to raise a frequency of the output signal while receiving the charging signal and generating a discharging action to lower the output current so as to lower the frequency of the output signal while receiving the discharging signal, a LPF coupled to the CP and the VCO, filtering a phase noise of the output current of the CP and generating the input signal of the VCO, a delta-sigma modulator (DSM) receiving an external input signal and generating a modulated signal, and an adder coupled to the DSM and the PFFD, receiving an external integer and the modulated signal, adding the external integer and the modulated signal and outputting a sum thereof to the PFFD so as to generate the plurality of moduli.

Preferably, the XO is a TCXO.

Preferably, the PFD is further employed to receive a polarity control signal (POL), the PFD outputs the charging signal when the POL=1 and the reference signal source leads the output signal, and the PFD outputs the discharging signal when the POL=0 and the output signal leads the reference signal source.

Preferably, the CP further includes a bias current source providing a current bias, a bias circuit coupled to the bias current source and providing a bias voltage, a first output current source coupled to the bias circuit and providing a first output current, a charging switch coupled to the PFD and the first output current source and generating the charging action when the charging signal is received, a discharging switch coupled to the PFD and the first output current source and generating the discharging action when the discharging signal is received, a first control switch coupled to the first output current source and controlling an output current of the CP, a second output current source coupled to the first control switch and providing a second output current, a second control switch coupled to the second output current source and controlling the output current of the CP, and a third output current source coupled to the second control switch and providing a third output current.

Preferably, the bias circuit is a standard low voltage bias circuit, the output current of the CP is the first output current when the first and the second control switches are both turned off, the output current of the CP is a sum of the first output current and the second output current when the first control switch is turned on and the second control switch is turned off, and the output current of the CP is a sum of the first output current, the second output current and the third output current when the first and the second control switches are both turned on.

Preferably, the LPF is a third-order LPF.

Preferably, the third-order LPF further includes a first capacitor having a first terminal coupled to the CP and a second terminal coupled to a ground, a first resistor having a first terminal coupled to the first terminal of the first capacitor and a second terminal, a second capacitor having a first terminal coupled to the second terminal of the first resistor and a second terminal coupled to the ground, a second resistor having a first terminal coupled to the first terminal of the first resistor and a second terminal, and a third capacitor having a first terminal coupled to the second terminal of the second resistor and the VCO and a second terminal coupled to the ground.

Preferably, the DSM is a third-order DSM.

Preferably, the DSM further includes a first first-order DSM receiving the external input signal and generating a first quantization noise and a first output signal, a second first-order DSM coupled to the first first-order DSM, receiving the first quantization noise and generating a second quantization noise and a second output signal, a third first-order DSM coupled to the second first-order DSM, receiving the second quantization noise and generating a third output signal, and a bit manipulation node coupled to the first, the second and the third first-order DSMs, receiving the first, the second and the third output signals and generating the modulated signal.

Preferably, the first, the second and the third first-order DSMs are 24 bit accumulators.

Preferably, the first first-order DSM is a 24 bit accumulator, the second first-order DSM is a 16 bit accumulator, and the third first-order DSM is a 8 bit accumulator.

According to the sixth aspect of the present invention, an FNPLL having an AMR includes an FNPLL circuit receiving an input signal, generating an output signal and including a PFFD receiving a feedback signal of the output signal and dividing a frequency of the feedback signal by one of a plurality of moduli having a fractional step size so as to generate a frequency divided output signal, and an MRCC adjusting the AMR formed by the plurality of moduli of the PFFD according to an MRCS.

Preferably, the DSM is a third-order DSM.

According to the seventh aspect of the present invention, a controlling method of an FFD includes one of the steps of: (a) making one of a first modulus control and a first feedback control signals in a first logic low state so as to generate a first modulus selection signal in the first logic low state in response to a dual-edge triggering of a first input signal such that a generation of a first output signal is not suppressed when the FFD is employed in dividing a frequency of the first input signal by an integer modulus; and (b) making one of a second modulus control and a second feedback control signals in a second logic low state so as to generate a second modulus selection signal in the second logic low state in response to a dual-edge triggering of a second input signal such that a generation of a second output signal is not suppressed for a time period of the second input signal, then making both a third modulus control and a third feedback control signals in a first logic high state so as to generate a third modulus selection signal in the first logic high state such that the generation of the second output signal is suppressed for a half of the time period of the second input signal, and recurring in a cycle thereof when the FFD is employed in dividing a frequency of the second input signal by a fractional modulus.

According to the eighth aspect of the present invention, a controlling method of a PFFD generating a first output signal through dividing a frequency of an input signal by one of a plurality of moduli each having a fractional step size and including an FFD generating a second output signal and a divider chain coupled to the FFD, including a plurality of IFDs, having any two neighboring ones of the plurality of IFDs coupled to each other in series and generating the first output signal includes the steps of: (a) making the FFD receive the input signal, one of a plurality of modulus control signals and a feedback control signal of the divider chain and each of the plurality of IFDs receive one of the plurality of modulus control signals and a feedback control signal of each of the plurality of IFDs; (b) dividing a frequency of the input signal by a first integer modulus to generate the second output signal when one of the modulus control signal of the FFD and the feedback control signal of the divider chain is in a logic low state and dividing the frequency of the input signal by a fractional modulus to generate the second output signal when one of the modulus control signal of the FFD and the feedback control signal of the divider chain is in a logic low state and to last for a time period of the input signal, then both the modulus control signal of the FFD and the feedback control signal of the divider chain are in a logic high state and to last for half of the time period of the input signal, and a cycle thereof is recurring; (c) dividing a frequency of a respective divider input signal of one of the plurality of IFDs by a second integer modulus to generate a respective divider output signal of one of the plurality of IFDs when one of the modulus control signal and the feedback control signal of one of the plurality of IFDs is in a logic low state; and dividing the frequency of the respective divider input signal of one of the plurality of IFDs by a third integer modulus to generate the respective divider output signal of one of the plurality of IFDs when both the modulus control signal and the feedback control signal of one of the plurality of IFDs are in a logic high state; and (d) making the PFFD generate the first output signal according to the input signal and one of the plurality of moduli.

According to the ninth aspect of the present invention, a controlling method of a PFFD having an AMR, generating a first output signal through dividing a frequency of an input signal by one of a plurality of moduli each having a fractional step size and including an FFD generating a second output signal, a divider chain coupled to the FFD, including a plurality of IFDs, having any two neighboring ones of the plurality of IFDs coupled to each other in series and generating the first output signal and an MRCC adjusting the AMR formed by the plurality of moduli includes the steps of: (a) making the MRCC generate a control signal so as to have one of a turn-on and a turn-off of a feedback control of a specific one of the plurality of IFDs and all other IFDs following the specific IFD to adjust the AMR; (b) making the FFD receive the input signal, one of a plurality of modulus control signals and a feedback control signal of the divider chain and each of the plurality of IFDs receive one of the plurality of modulus control signals and a feedback control signal of each of the plurality of IFDs; (c) dividing a frequency of the input signal by a first integer modulus to generate the second output signal when one of the modulus control signal of the FFD and the feedback control signal of the divider chain is in a logic low state and dividing the frequency of the input signal by a fractional modulus to generate the second output signal when one of the modulus control signal of the FFD and the feedback control signal of the divider chain is in a logic low state and to last for a time period of the input signal, then both the modulus control signal of the FFD and the feedback control signal of the divider chain are in a logic high state and to last for half of the time period of the input signal, and a cycle thereof is recurring; (d) dividing a frequency of a respective divider input signal of one of the plurality of IFDs by a second integer modulus to generate a respective divider output signal of one of the plurality of IFDs when one of the modulus control signal and the feedback control signal of one of the plurality of IFDs is in a logic low state; and dividing the frequency of the respective divider input signal of one of the plurality of IFDs by a third integer modulus to generate the respective divider output signal of one of the plurality of IFDs when both the modulus control signal and the feedback control signal of one of the plurality of IFDs are in a logic high state; and (e) making the PFFD generate the first output signal according to the input signal and one of the plurality of moduli.

According to the tenth aspect of the present invention, a controlling method of a FNPLL includes the steps of: (a) making a VCO receive an input signal and generate an output signal; and (b) making a PFFD receive a feedback signal of the output signal and divide a frequency of the feedback signal by one of a plurality of moduli having a fractional step size so as to generate a frequency divided output signal.

Preferably, the method further includes the steps of: (c) making an XO generate a reference signal source; (d) comparing a phase and a frequency of the reference signal source and a phase and a frequency of the frequency divided output signal by a PFD so as to generate one of a charging and a discharging signals; (e) making a CP generate a charging action while receiving the charging signal to raise an output current so as to raise the frequency of the frequency divided output signal and generate a discharging action while receiving the discharging signal to lower the output current so as to lower the frequency of the frequency divided output signal; (f) filtering a phase noise of the output current of the CP by a LPF and generating the input signal of the VCO accordingly; (g) making a DSM receive an external input signal and generate a modulated signal; (h) making an adder receive an external integer and the modulated signal, add the external integer and the modulated signal and output a sum thereof to the PFFD so as to generate the plurality of moduli; and (i) making a frequency of the output signal of the VCO stabilize at a product of the frequency of the reference signal source and a mean value of the plurality of moduli after a plurality of operations of the FNPLL.

According to the eleventh aspect of the present invention, a controlling method of a FNPLL having an AMR includes the steps of: (a) making a VCO receive an input signal and generate an output signal; and (b) making a PFFD having the AMR receive a feedback signal of the output signal and divide a frequency of the feedback signal by one of a plurality of moduli having a fractional step size so as to generate a frequency divided output signal and adjust the AMR according to an MRCS received by the PFFD.

Preferably, the method further includes the steps of: (c) making an XO generate a reference signal source; (d) comparing a phase and a frequency of the reference signal source and a phase and a frequency of the frequency divided output signal by a PFD so as to generate one of a charging and a discharging signals; (e) making a CP generate a charging action while receiving the charging signal to raise an output current so as to raise the frequency of the frequency divided output signal and generate a discharging action while receiving the discharging signal to lower the output current so as to lower the frequency of the frequency divided output signal; (f) filtering a phase noise of the output current of the CP by a LPF and generating the input signal of the VCO accordingly; (g) making a DSM receive an external input signal and generate a modulated signal; (h) making an adder receive an external integer and the modulated signal, add the external integer and the modulated signal and output a sum thereof to the PFFD so as to generate the plurality of moduli; and (i) making a frequency of the output signal of the VCO stabilize at a product of the frequency of the reference signal source and a mean value of the plurality of moduli after a plurality of operations of the FNPLL.

The present invention may be best understood through the following descriptions with reference to the accompanying drawings, in which:

DETAILED DESCRIPTION OF THE PREFERRED EMBODIMENT

Figure 1:
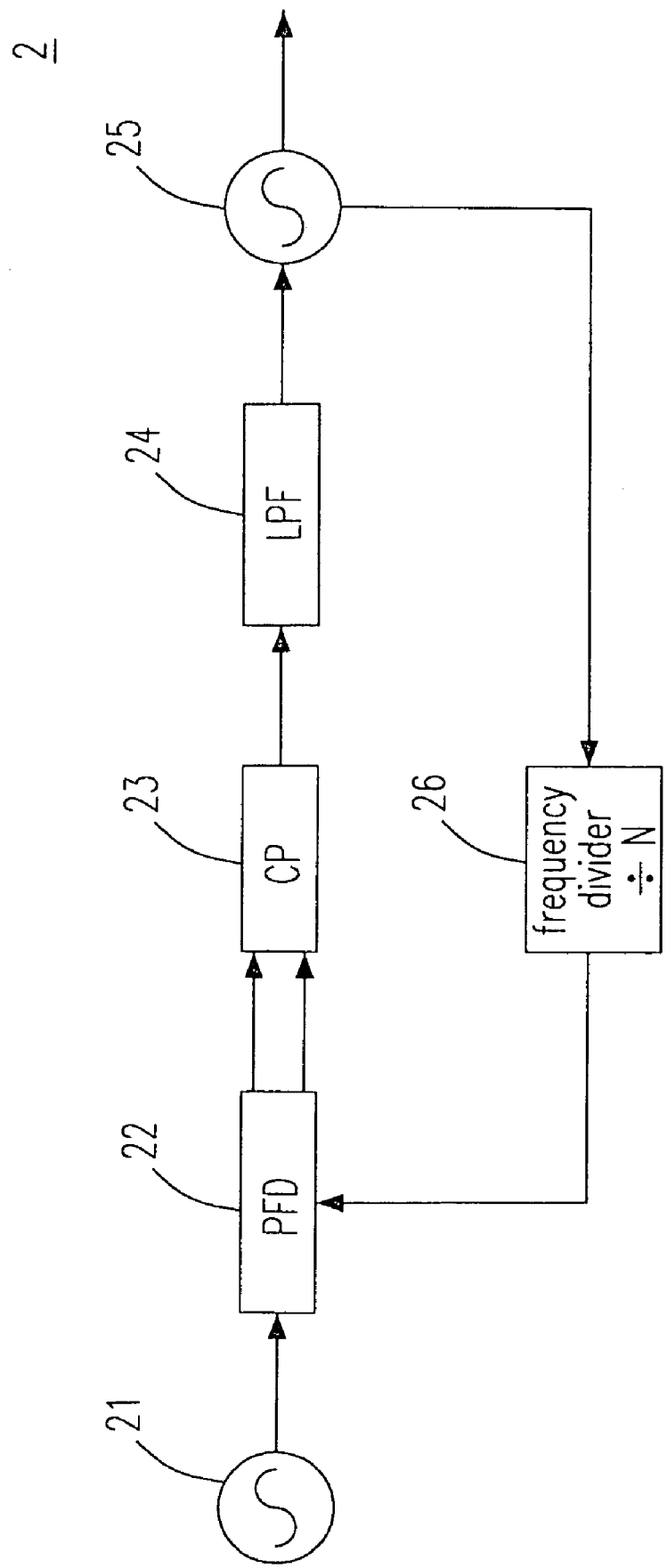
FIG. 1 is the block diagram of a conventional PLL frequency synthesizer.
Figure 2:
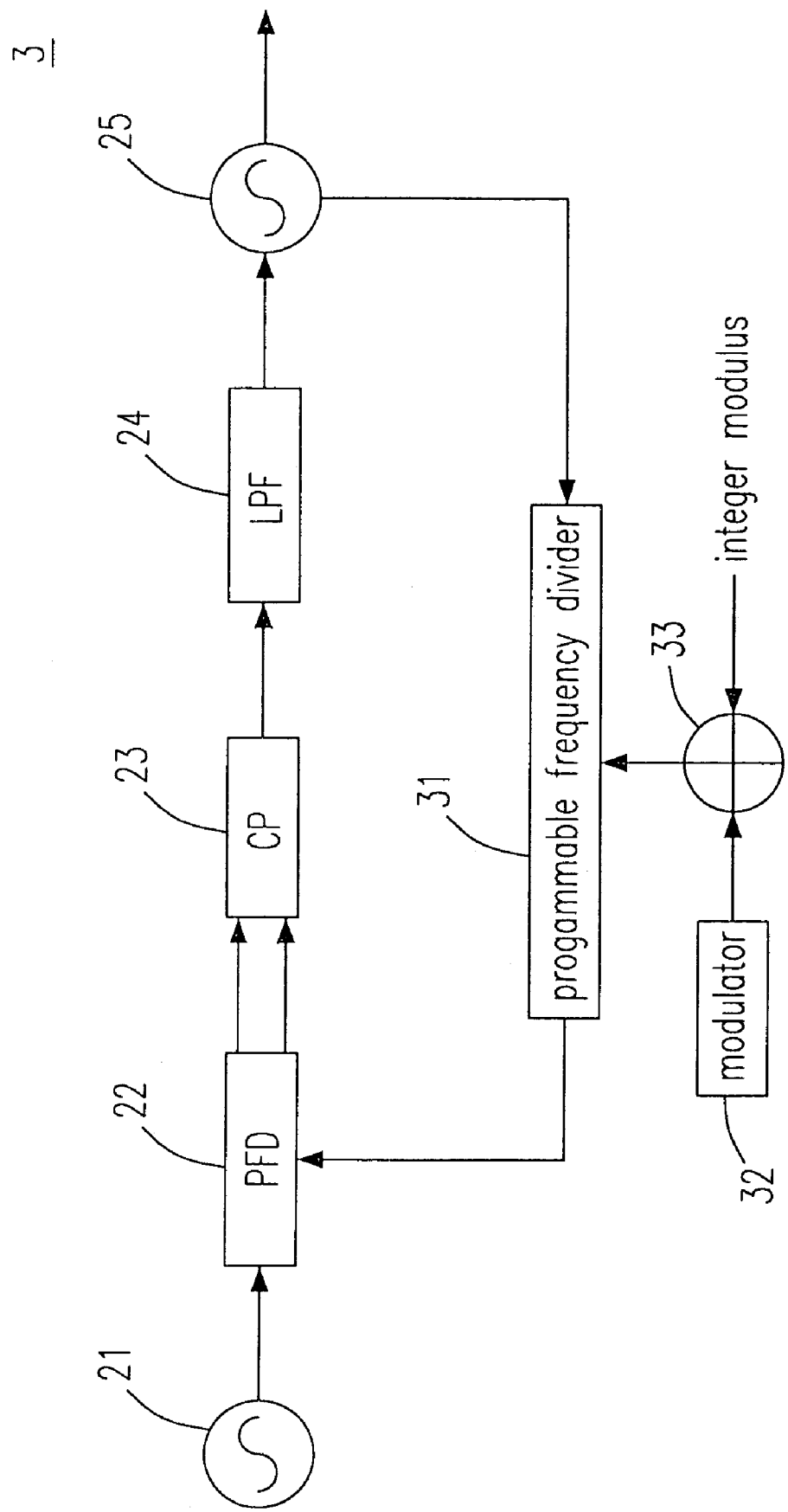
FIG. 2 is the block diagram of a conventional Fractional-N PLL frequency synthesizer.
Figure 3:
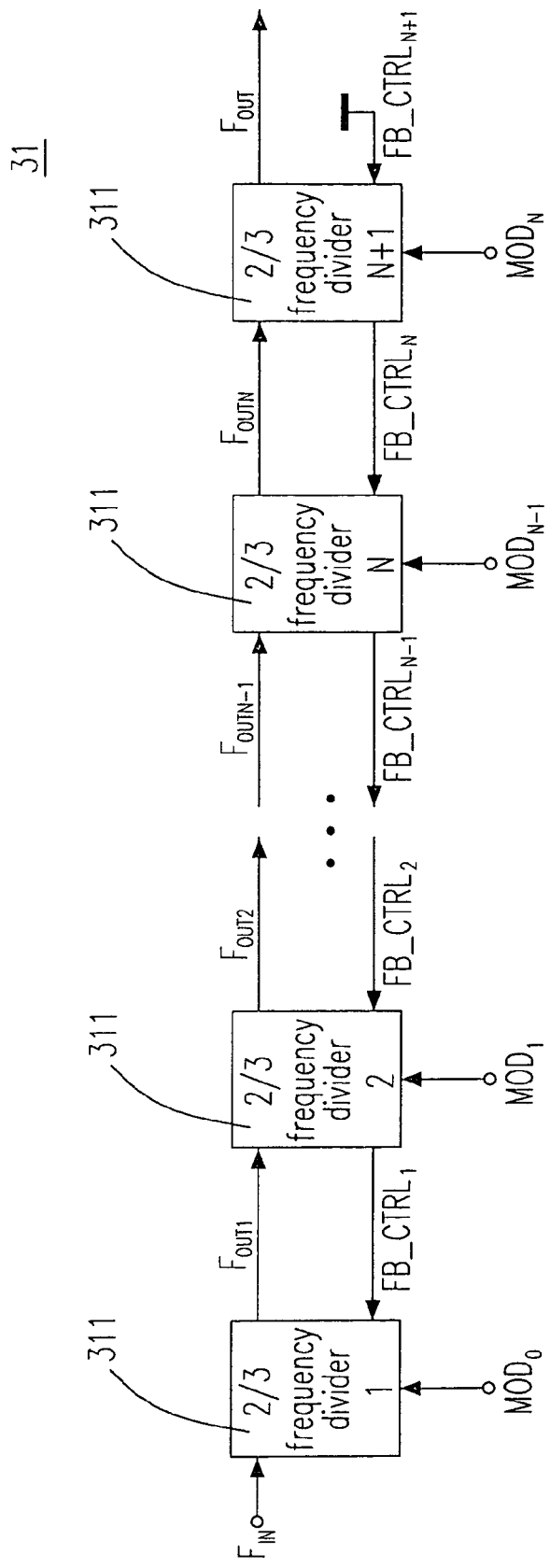
FIG. 3 is the schematic circuit diagram of a conventional PFFD.
Figure 4:
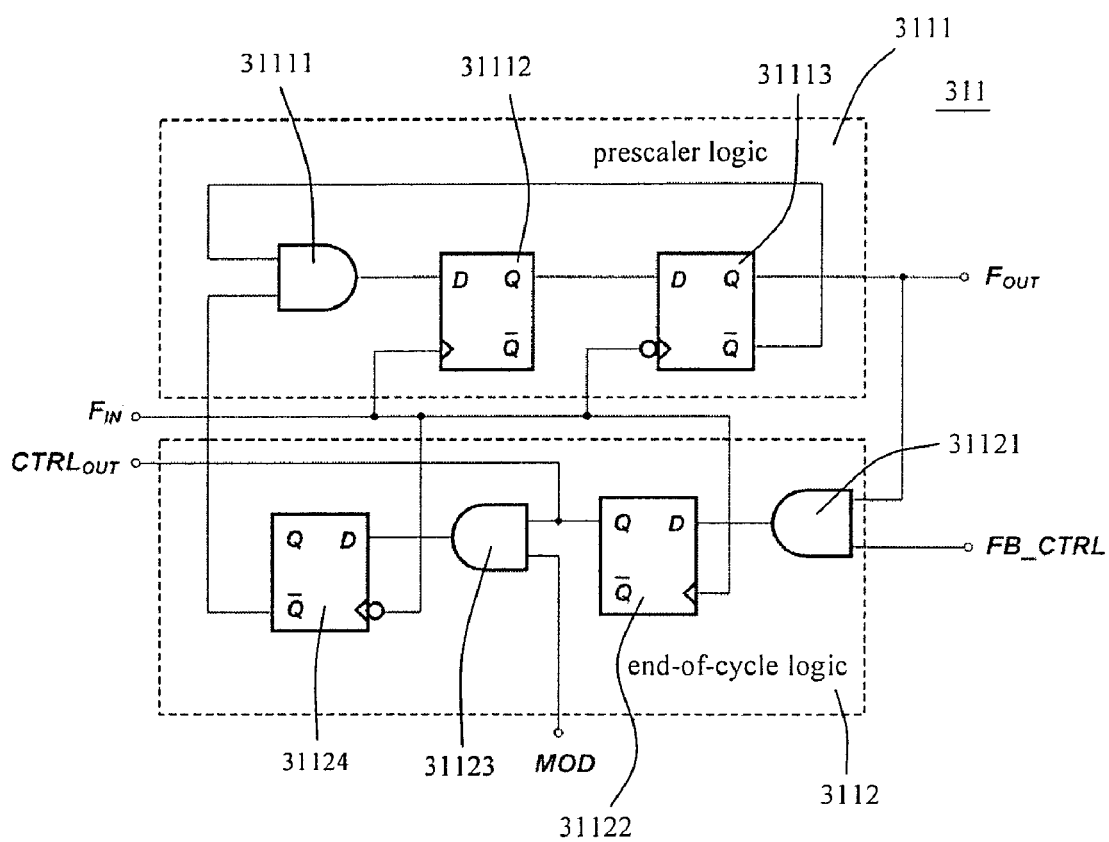
FIG. 4 is the schematic circuit diagram of a conventional 2/3 frequency divider.

To overcome the aforementioned two drawbacks, several different configurations of the frequency dividers according to the preferred embodiments of the present invention are provided. Please refer to FIG. 5, which shows the schematic circuit diagram of a 1/1.5 frequency divider 411 according to the first preferred embodiment of the present invention. The principles of the DET are employed in the provided circuit of FIG. 5, and the latches electrically connected in series in the conventional 2/3 frequency divider as shown in FIG. 4, the first latch 31112 and the second latch 31113, and the third latch 31122 and the fourth latch 31124, are replaced by the latches electrically connected in parallel and a multiplexer (the first latch 41114, the second latch 41115 and the first multiplexer 41116/the third latch 41122, the fourth latch 41123 and the second multiplexer 41124 respectively). In which, the first latch 41114 and the third latch 41122 are latches triggered by a falling edge of an input signal of the 1/1.5 frequency-divider 411, the second latch 41115 and the fourth latch 41123 are latches triggered by a rising edge of the input signal of the 1/1.5 frequency-divider 411, and the appropriate dual-edge triggering effects can be accomplished by including an additional multiplexer i.e. one of the multiplexer 41116 and the multiplexer 41124 to each set of latches respectively. The 1/1.5 frequency-divider 411 includes an FDU 4111 and an MCU 4112. The FDU 4111 further includes a first NOT gate 41111, a first AND gate 41112 and a second NOT gate 41113 except for the first latch 41114, the second latch 41115 and the first multiplexer 41116. And the MCU 4112 further includes a second AND gate 41121 and a third AND gate 41125 except for the third latch 41122, the fourth latch 41123 and the second multiplexer 41124. In which, the MCU 4112 is employed to generate an MSS either to suppress the operation of the FDU 4111 and the generation of an output signal of the frequency divider 411 when the MSS is logic 1, or not to suppress the operation of the FDU 4111 and the generation of the output signal of the frequency divider 411 when the MSS is logic 0. And the FDU 4111 is employed to divide the frequency of the input signal by one of an integer modulus 1 and a fractional modulus 1.5 according to the DET of the input signal and the MSS. Just like the 2/3 frequency divider, the provided 1/1.5 frequency divider 411 will divide the frequency of the input signal by 1.5 only when both of the MOD and FB_CTRL are logic 1, and FIG. 6 is the timing chart of the 1/1.5 frequency divider according to the first preferred embodiment of the present invention 411 in the divide-by-1.5 mode; otherwise, the output signal will simply follow the input signal, i.e. in the divide-by-1 mode.

Figure 7:
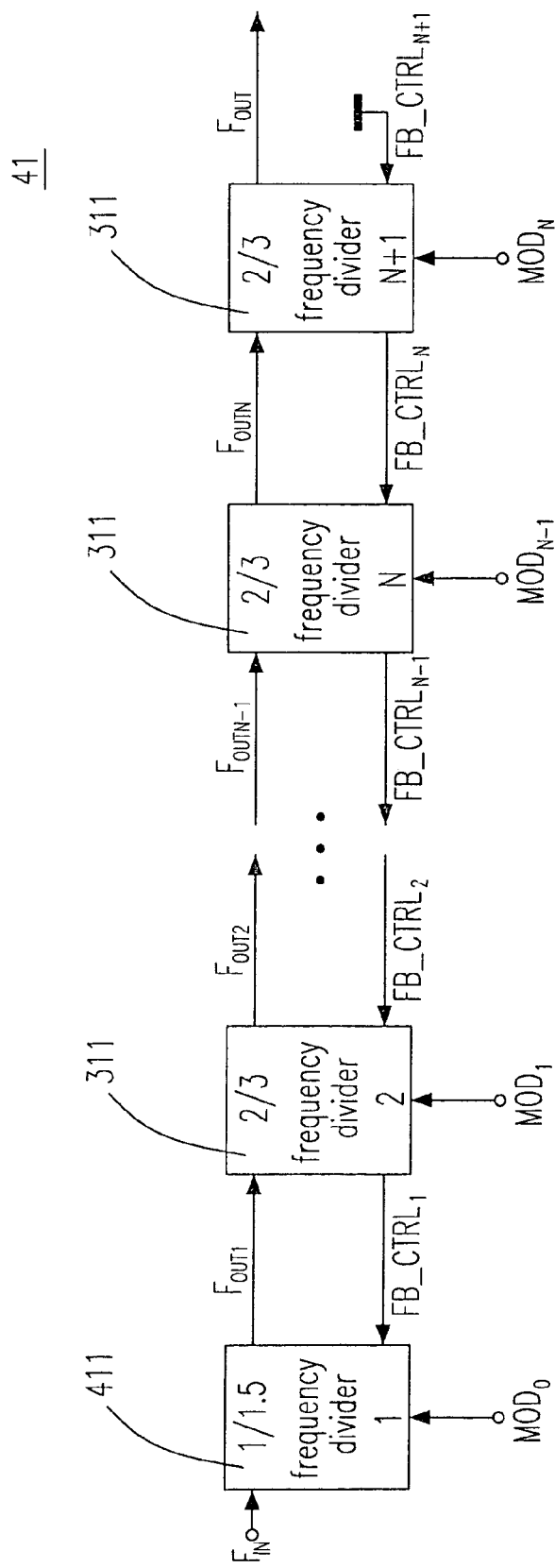
FIG. 7 is the schematic circuit diagram of a PFFD having a modulus resolution of 0.5 according to the second preferred embodiment of the present invention.

Based on the provided 1/1.5 frequency divider 411, a dual-mode PFFD can be implemented. The first mode of this dual-mode PFFD is to achieve intrinsic fractional modulus and the other is to generate the 50% duty-cycle output signals in all integer modulus. The core circuit of the provided dual-mode PFFD having a modulus step size (modulus resolution) of 0.5, 41, includes a 1/1.5 frequency divider 411 and the plurality of 2/3 frequency divider 311 of the PFFD 31 electrically connected to the 1/1.5 frequency divider 411 in series as shown in FIG. 7. Just like the PFFD 31, the modulus of the PFFD having a modulus step size of 0.5, 41, can be derived as follow:

$$T_{OUT}=(2^N+2^{N-1}\cdot MOD_N+\ldots+2\cdot MOD_2+MOD_1+0.5\cdot MOD_0)\cdot T_{IN} \quad (4)$$

Similarly, $T_{OUT}$ is the time period of the output signal $F_{OUT}$, $T_{IN}$ is the time period of the input signal $F_{IN}$, and the dividing range (modulus range) formed by the plurality of moduli is ranged from $2^N$ to $2^{N+1}-0.5$. Since the step size (resolution) of each modulus is 0.5, the modulated resolution is shrunk to half of the original size, i.e. 0.5. For a PLL employing a DSM, the phase noise contributed by this modulator $S\Phi$ can be expressed as follows:

$$S_\phi = \frac{1}{M^2} \cdot \left(\frac{\overline{f_{out}}}{f}\right)^2 \cdot (F\{|b(t) - k|^2\}) \qquad (5)$$

In which, M is the average modulus, $f_{out}$ is the average divider output frequency, F{ } denotes Fourier transform, b(t) is the modulated signal generated by the modulator, and k is the fractional part of the predetermined modulus.

Since the modulus resolution of the present invention has reached 0.5, a half of that of the conventional PFFD, and b(t) with a step size of 1 is replaced by b(t) with a step size of 0.5 in the above-mentioned formula, thus the phase noise contributed by the PFFD having the modulus resolution of 0.5 can be lowered by 6 dB.

Figure 8:
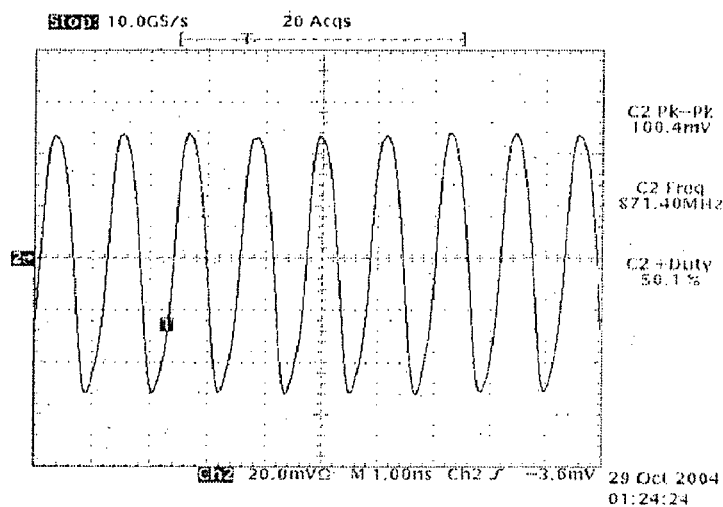
FIG. 8 illustrates the measured 50% duty free cycle output waveform (871 MHz) of the divide-by-three circuit according to the second preferred embodiment of the present invention when a 2.6 GHz input signal is applied.

To verify the functions of the above-mentioned frequency divider 411, which has the moduli 1/1.5, a divide-by-3 circuit having the 50% duty cycle and a dual-mode PFFD according to the PFFD having a modulus resolution of 0.5, 41 as shown in FIG. 7, are both realized. When a 2.6 GHz input signal is applied, the measured output signal of the divide-by-3 circuit is shown in FIG. 8. Referring to FIG. 8, the frequency of the output signal (871 MHz) is 1/3 of the frequency of the input signal, and the 50% duty cycle is achieved.

Figure 9:
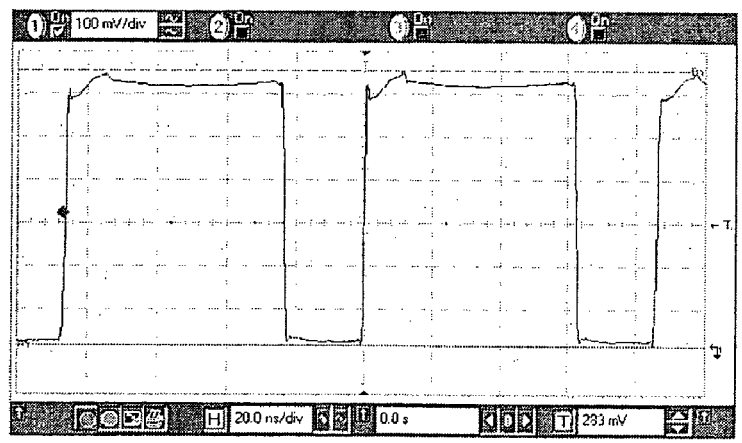
FIG. 9 illustrates the measured output waveform (10.02 MHz) of the PFFD according to the second preferred embodiment of the present invention when the modulus=255.5 and a 2.56 GHz input signal is applied.
Figure 10:
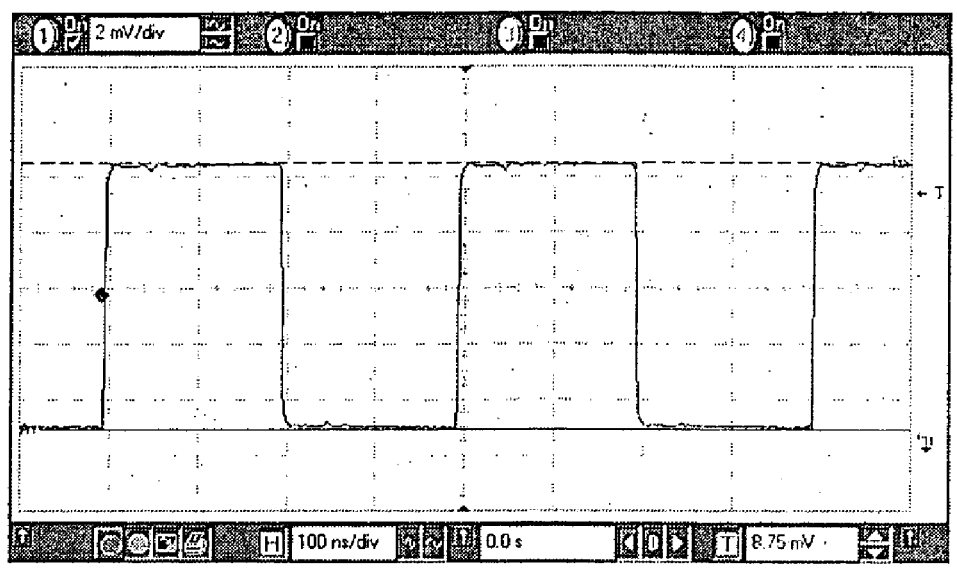
FIG. 10 illustrates the measured output waveform (2.504 MHz) of the PFFD according to the second preferred embodiment of the present invention when the modulus=511 and a 1.28 GHz input signal is applied.

As for the dual-mode PFFD, which is realized by 8 bit, and includes a 1/1.5 frequency divider 411 and seven 2/3 frequency dividers 311s. According to formula (4), the modulus range is from 128 to 255.5 and the step size is 0.5 when it is in the intrinsic fractional mode, and the modulus range is from 256 to 511 and the step size is 1 when it is in the integer mode. In FIG. 9, it illustrates the measured output waveform of the PFFD according to the second preferred embodiment of the present invention when the modulus=255.5 and a 2.56 GHz input signal is applied. Please refer to FIG. 9, it shows that the frequency of the output signal is 10.02 MHz corresponding to the right division ratio. Referring to FIG. 10, it illustrates the measured output waveform of the PFFD according to the second preferred embodiment of the present invention when the modulus=511 and a 1.28 GHz input signal is applied. In FIG. 10, it shows that the frequency of the output signal is 2.504 MHz, which is 1/511 of the frequency of the input signal. Please note that the output waveform of FIG. 10 achieves the 50% duty cycle.

Figure 11:
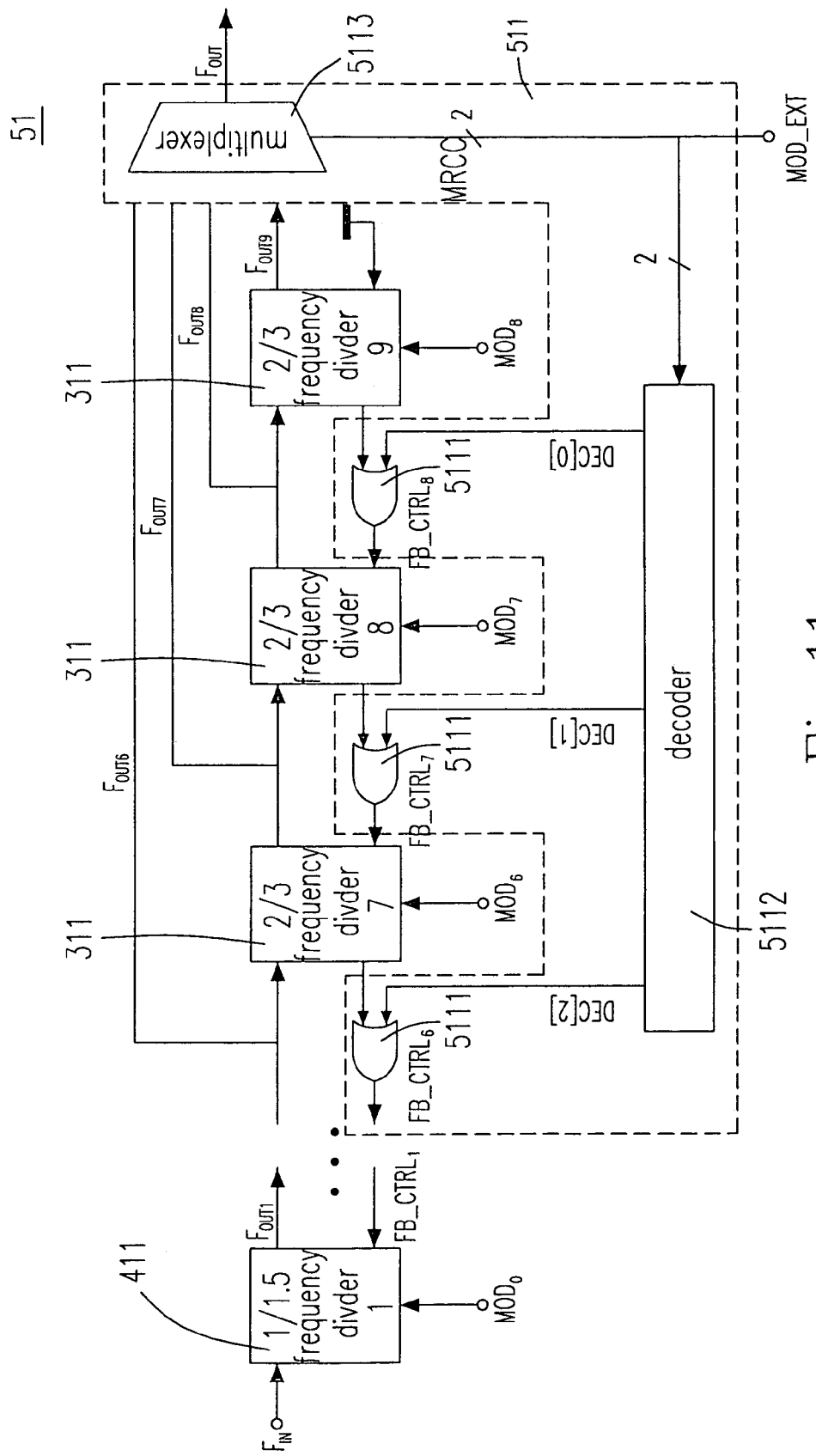
FIG. 11 is the schematic circuit diagram of a PFFD having an AMR according to the third preferred embodiment of the present invention.

For increasing the modulus range of the FFD, the schematic circuit diagram of a PFFD 51 having an MRCC 511 according to the third preferred embodiment of the present invention is provided and shown in FIG. 11. Please refer to FIG. 11, the MRCC 511 includes a plurality of OR gates 5111s, a decoder 5112 and a 4 to 1 multiplexer 5113, which is employed to interrupt the feedback control signal of the last few stages of frequency dividers. An OR gate 5111 is inserted between two frequency dividers such that the OR operation of the feedback signal and another control signal is engaged and the result of the OR operation is feedback to the prior stage of the frequency divider, and the control signal is generated by the decoder 5112 according to the inputted MRCS MOD_EXT. The operational principles of the whole circuit 51 are described as follows. The output signal of the decoder 5112, DEC[2:0]=000, the multiplexer 5113 will choose the $F_{OUT9}$ as the output signal, and the modulus range is from $2^8$ to $2^9$–0.5 when the inputted MOD_EXT=00. The output signal of the decoder 5112, DEC[2:0]=001, when the inputted MOD_EXT=01. Since DEC[0]=1, thus FB_CTRL$_8$ will be maintained at logic 1, and the 2/3 frequency divider of the eighth stage 8(311) will not influenced by the feedback control of the 2/3 frequency divider of the next stage 9(311). And then, $F_{OUT8}$ is chosen as the output signal, the 2/3 frequency divider of the last stage 9(311) is removed equivalently, and the modulus range is from $2^7$ to $2^8$–0.5. By the same token, the modulus range of the PFFD 51 having the MCC 511 of FIG. 11 is derived and ranged from $2^5$ to $2^9$–0.5, and the control signals and the corresponding modulus range of the PFFD 51 are listed in Table 1.

Experimental Results

1. System Configuration

Figure 12A:
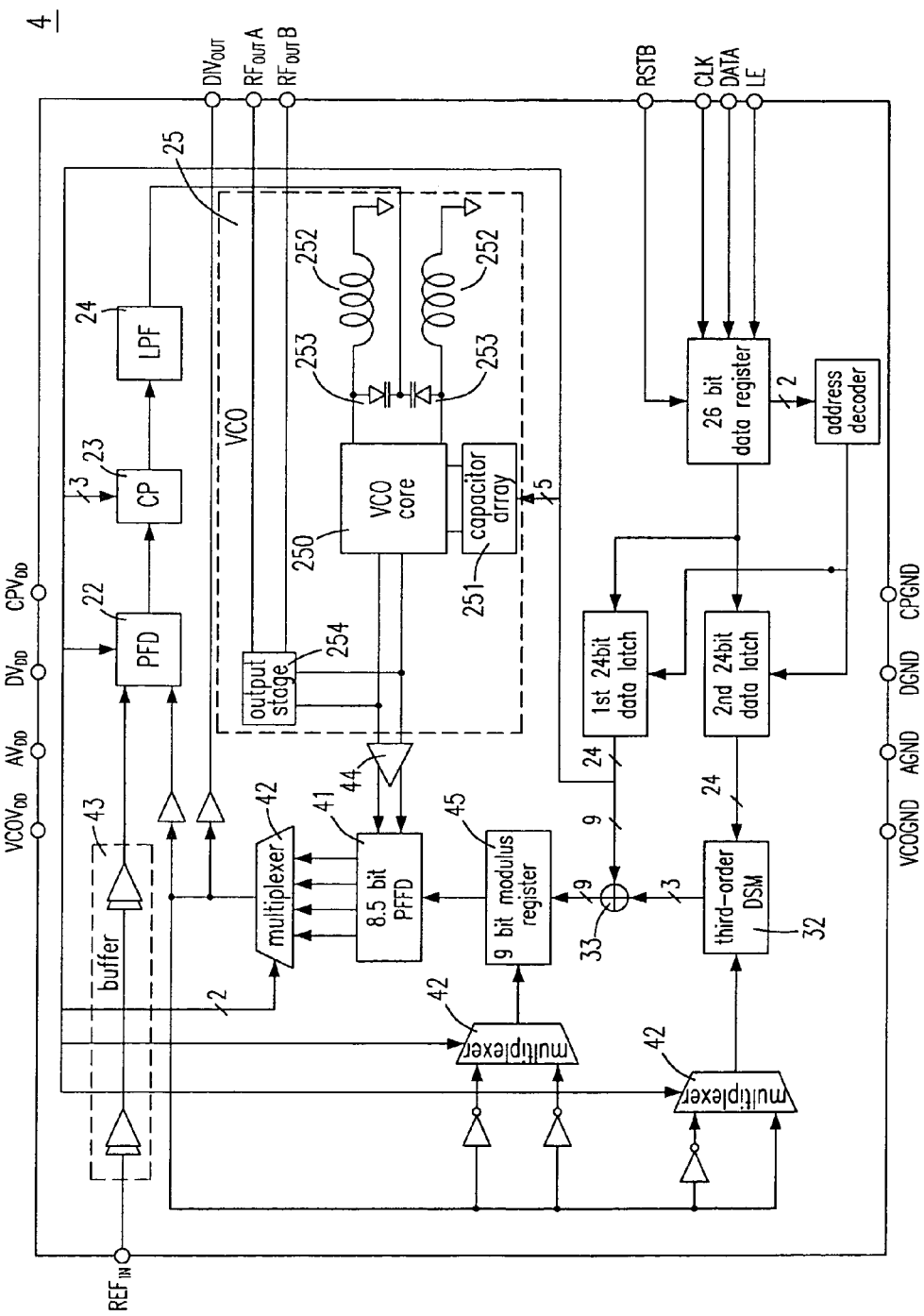
FIGS. 12(a) to 12(c) are the system block diagram of a FNPLL frequency synthesizer according to the fourth preferred embodiment of the present invention, the block diagram of the main circuit of the FNPLL frequency synthesizer according to the fourth preferred embodiment of the present invention and the block diagram of the main circuit of a FNPLL frequency synthesizer according to the fifth preferred embodiment of the present invention respectively.

FIG. 12(a) is a complete system block diagram of a FNPLL frequency synthesizer 4 according to the fourth preferred embodiment of the present invention. Except for the main circuit of the FNPLL having

TABLE 1

Control Signals and Corresponding Modulus Range of PFFD 51

Figure 12B:
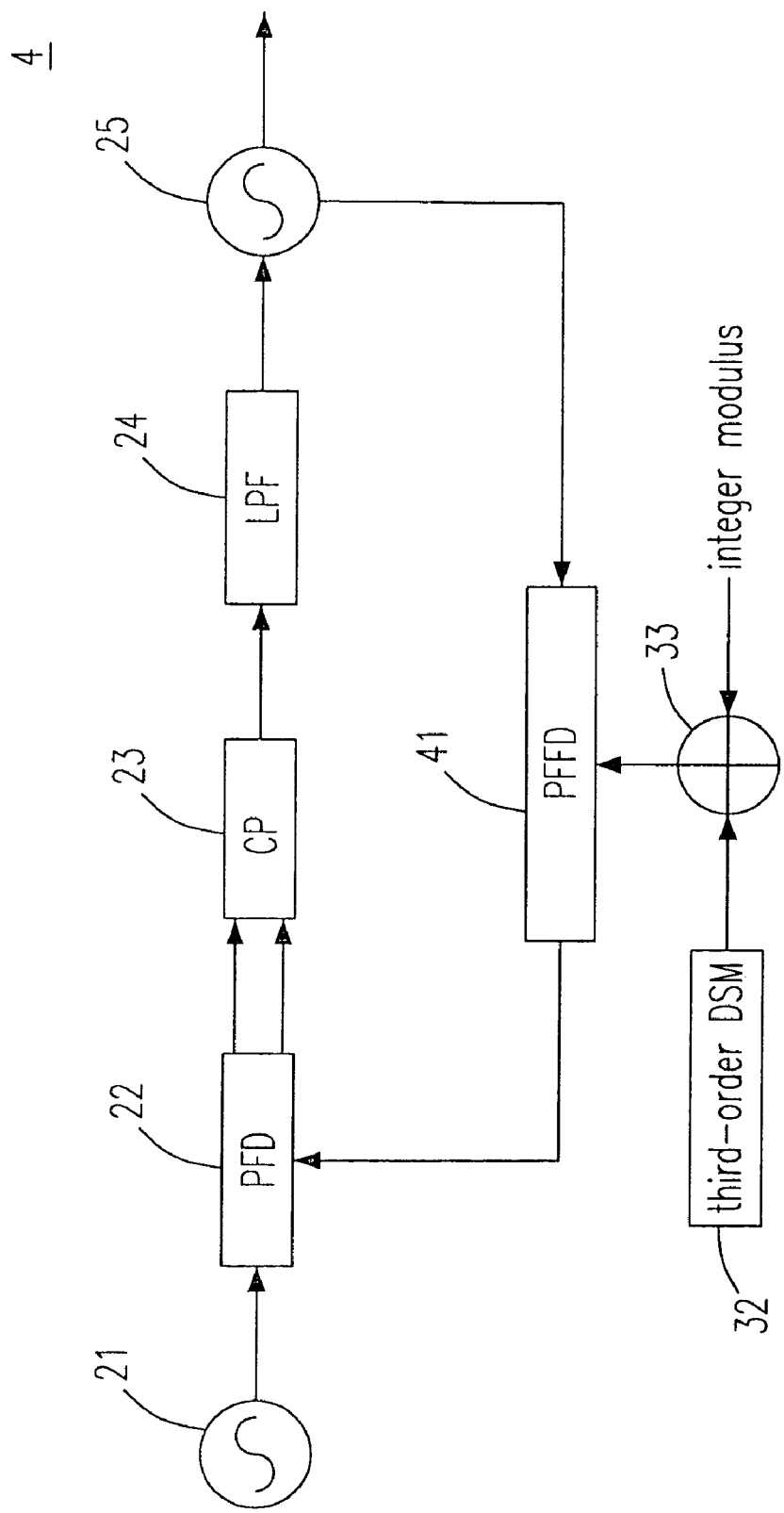
Figure 12C:
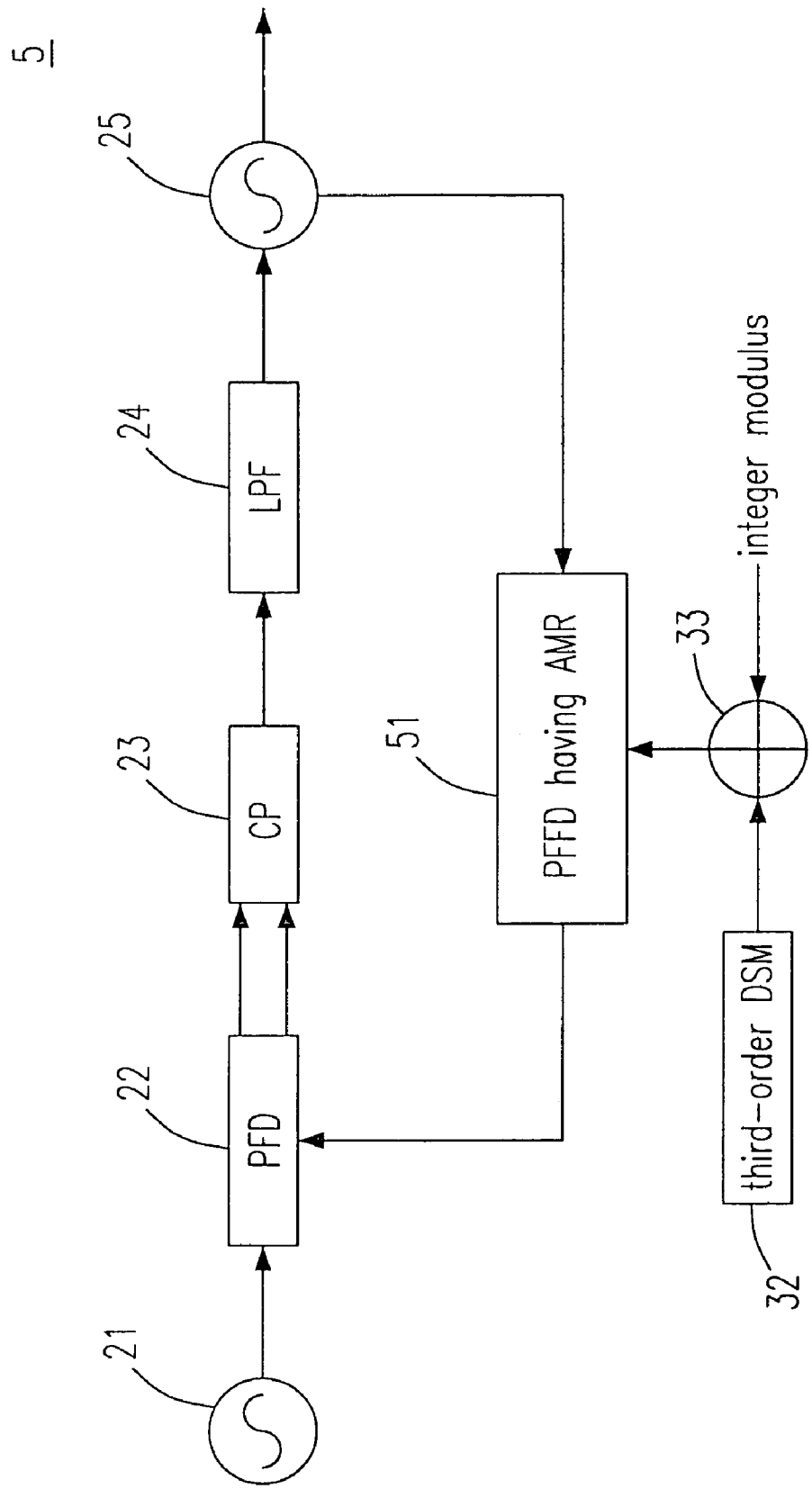

| MOD_EXT[1:0] | DEC[2:0] | MUX Selection | Modulus Range |
|---|---|---|---|
| 00 | 000 | $F_{OUT9}$ | $2^8$–$2^9$-0.5 |
| 01 | 001 | $F_{OUT8}$ | $2^7$–$2^8$-0.5 |
| 10 | 010 | $F_{OUT7}$ | $2^6$–$2^7$-0.5 |
| 11 | 100 | $F_{OUT6}$ | $2^5$–$2^6$-0.5 | a modulus resolution of 0.5, 4 (as shown in FIG. 12(b)), which includes a PFD 22, a CP 23, a LPF 24, a VCO 25 (including a VCO core 250, a capacitor array 251, two resonant inductors 252s and two voltage controlled capacitors 253s), a third-order DSM 32, an adder 33 and a PFFD having a modulus resolution of 0.5, 41, other interface circuits are also shown in FIG. 12(a), which includes: (1) the buffer of the reference signal source 43 for amplifying the external reference signal REF$_{IN}$ and modulating the amplitude of which to the logic level of CMOS required by the PFD 22, (2) the output stage of the VCO 254, which must have enough driving capability to drive a load of 50Ω, and the interface circuit between VCO and PFFD, 44, (3) the output multiplexer of the PFFD 42, which is a 4 to 1 multiplexer since there are two kinds of outputs of the PFFD 41 for the consideration of polarities, one goes through a NOT gate and the other doesn't, these two kinds of outputs would further choose between going through a divide-by-2 circuit so as to achieve the 50% duty cycle due to the provided PFFD 41 has a modulus resolution of 0.5 or not going through, and there are four kinds of outputs in total, (4) the multiplexer of the timing signal of the modulus register 45 and DSM 32, 42, which is added in front of the modulus register 45 and DSM 32 such that the triggering polarities could be changed to observe its influence during the experiment since the PFD 22 is triggered by the rising edge of the input signal, and if the modulus is changed during the period of the rising edge of the input signal, there may be a unknown error. Furthermore, the block diagram of the main circuit of the FNPLL frequency synthesizer according to the fifth preferred embodiment of the present invention is shown in FIG. 12(c). In which, the FNPLL having the modulus resolution of 0.5 and an adjustable modulus range (AMR), 5, is different from the aforementioned FNPLL having the modulus resolution of 0.5, 4, in that the PFFD 41 having a modulus resolution of 0.5 is replaced by the PFFD 51 having a modulus resolution of 0.5 and an AMR. Since there are many control signals in the chip built according to FIG. 12(a), the 3 wire serial interface (TWIF) commonly applied to the commercial chips is employed, and the control signals are inputted as arrays and sent through registers to specific latches so as to save the I/O pads.

Figure 13:
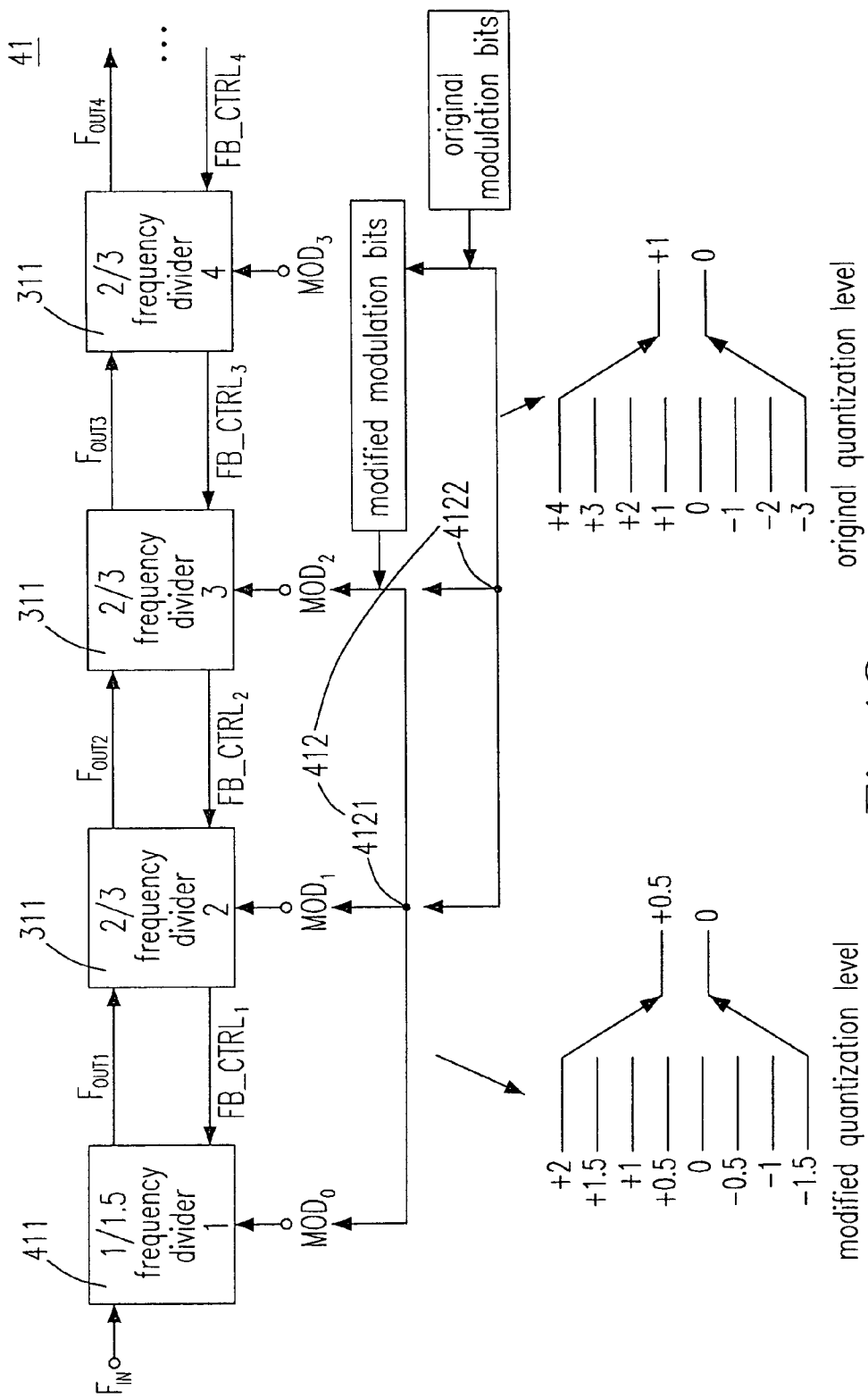
FIG. 13 is the schematic circuit diagram of a PFFD having a modulus combiner according to the sixth preferred embodiment of the present invention.

To verify that the provided 1/1.5 frequency divider 411 could really suppress the quantization noises, a modulus combiner 412 is designed and provided (as shown in FIG. 13), which includes a combining element for the first three least significant bits (LSBs) 4121 and a combining element for the next three LSBs 4122, is employed to combine the integer moduli and the fractional moduli, and has the functions of moving the modulation bits of the PFFD having the modulus resolution of 0.5, 41. That is the output signals of the combining element for the first three LSBs 4121 are inputted to the first frequency divider (1/1.5frequency divider 411), the second frequency divider (2/3 frequency divider 311) and the third frequency divider (2/3 frequency divider 311), which have the modified quantization level of 0.5, the output signals of the combining element for the next three LSBs 4122 are inputted to the second frequency divider (2/3 frequency divider 311), the third frequency divider (2/3 frequency divider 311) and the fourth frequency divider (2/3 frequency divider 311), which have the original quantization level of 1, and one of the combining element for the first three LSBs 4121 and the combining element for the next three LSBs 4122 can be chosen and is modulated by the DSM modulator (which receives the modified modulation bits and the original modulation bits respectively as shown in FIG. 13). Thus, the features of the FNPLL frequency synthesizer with the phase noises caused by the 1/1.5 frequency divider 411 and without the phase noises caused by the 1/1.5 frequency divider 411 can be compared with each other at the same synthesized frequency.

2. Measured Results

Figure 14:
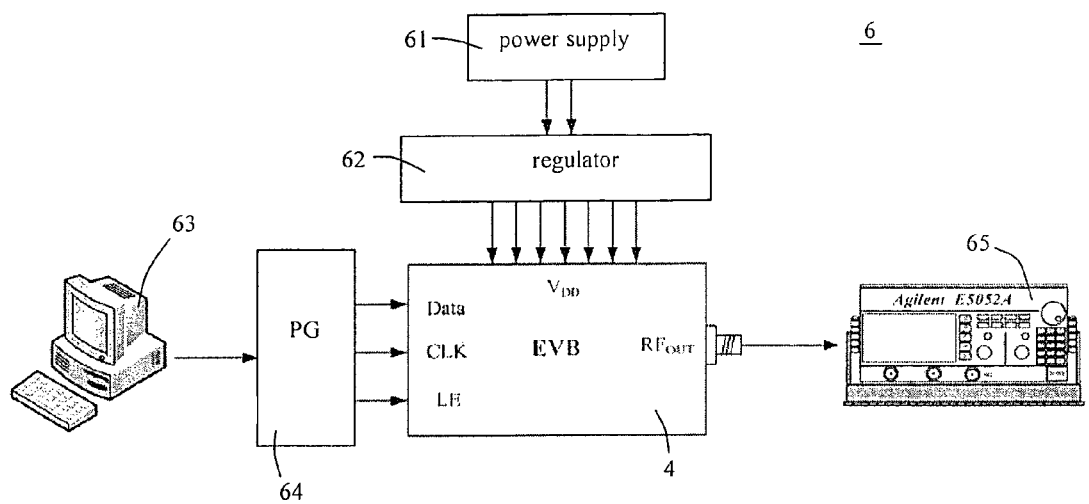
FIG. 14 shows the measuring apparatus for the chip built according to FIG. 12(a)

FIG. 14 shows the measuring apparatus for the above-mentioned chip 4 built according to FIG. 12(*a*). The chip 4 is measured via a printed circuit board. The measuring apparatus 6 includes a power supply 61 providing a power source, a regulator 62 stabilizing the power source and then offering to the to be measured chip 4, a PC 63, and a programmable data generator (PG) 64 and a signal source analyzer 65 (Agilent E5052A SSA). In which, the control signals are generated via the PC 63 firstly and through the PG 64 secondly so as to produce the required signal modes to control the FNPLL 4. All the measured results are measured by the aforementioned signal source analyzer 65 (Agilent E5052A SSA) except that expressed differently.

Figure 15:
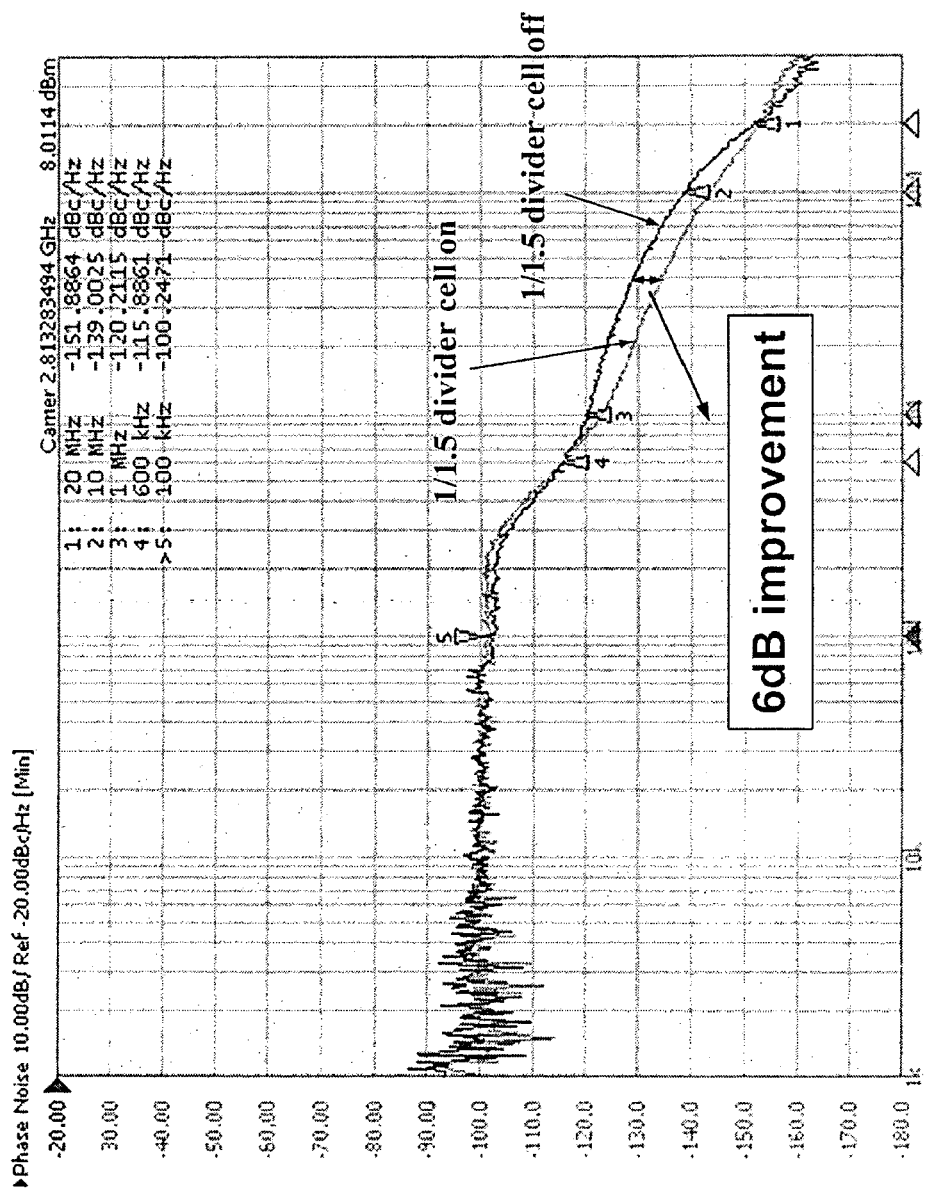
FIG. 15 illustrates the measured phase noise profiles of the chip built according to FIG. 12(a) when the reference signal frequency is 33 MHz, the carrier frequency is 2813 MHz and the 1/1.5 frequency divider 411 is turned on and off respectively.

FIG. 15 illustrates the measured phase noise profiles of the chip built according to FIG. 12(*a*) when the reference signal frequency is 33 MHz, the carrier frequency is 2813 MHz, and the 1/1.5 frequency divider 411 is turned on and off respectively (corresponding to the above-mentioned conditions that one of the 1st/2nd/3rd frequency dividers and the 2nd/3rd/4th frequency dividers are modulated by the DSM). Clearly, through the help of the provided 1/1.5 frequency divider 411, the phase noise outside the frequency band and contributed by the DSM is really decreased by 6 dB (it decreases from −129 to −135 dBc/Hz when the offset is 4 MHz), it is exactly the same as the theoretically predicted value.

Figure 16:
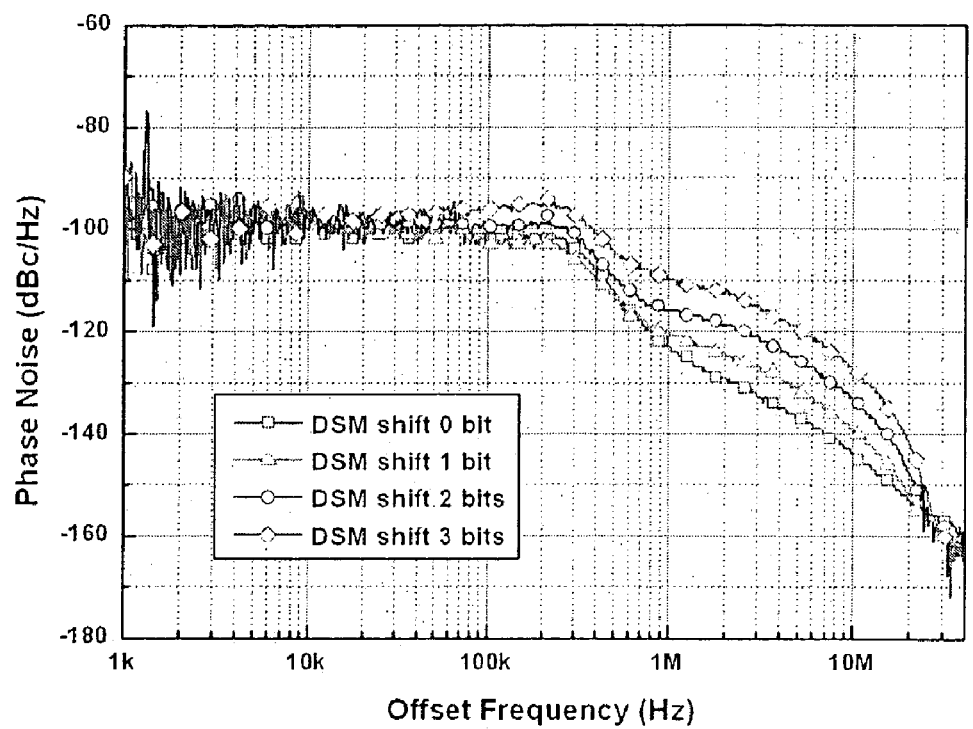
FIG. 16 illustrates the measured phase noise profiles of the chip built according to FIG. 12(a) when the modulus combiner has the same carrier frequency and the DSM has different modulating bits of 0 bit, 1 bit, 2 bits and 3 bits respectively.

Actually, the aforementioned modulus combiner 412 can move the modulation bits in four different modes. In Mode 1, the modulation bits are inputted to the 1st/2nd/3rd frequency dividers (the DSM being moved by 0 bit). In Mode 2, the modulation bits are inputted to the 2nd/3rd/4th frequency dividers (the DSM being moved by 1 bit). In Mode 3, the modulation bits are inputted to the 3rd/4th/5th frequency dividers (the DSM being moved by 2 bit). In Mode 4, the modulation bits are inputted to the 4th/5th/6th frequency dividers (the DSM being moved by 3 bit). Since the modulus resolutions of these four modes are 0.5, 1, 2 and 4 respectively, the phase noises contributed by the DSM having the modulus resolutions of 0.5, 1, 2 and 4 can be compared. The measured phase noise profiles of the chip built according to FIG. 12(*a*) when the modulus combiner has the same carrier frequency and the DSM has different modulating bits of 0 bit, 1 bit, 2 bits and 3 bits respectively are illustrated as shown in FIG. 16. Clearly, the phase noise is controlled by the DSM at the frequency outside the loop bandwidth, and the movement of the modulation bits is 1 bit. That is the phase noises are really increased when the modulus resolution (step size) is relatively larger, and the difference is the same as the formula (5) has predicted, exactly 6 dB. Thus, the provided FNPLL frequency synthesizer 4 are relatively better than the frequency synthesizers in the prior art, which makes the quantization noises comes from the DSM decrease up to 6 dB.

The operational principles and the steps of the controlling methods of the above-mentioned FFD, PFFD, PFFD having the AMR, and the FNPLL are described as follows.

Figure 5:
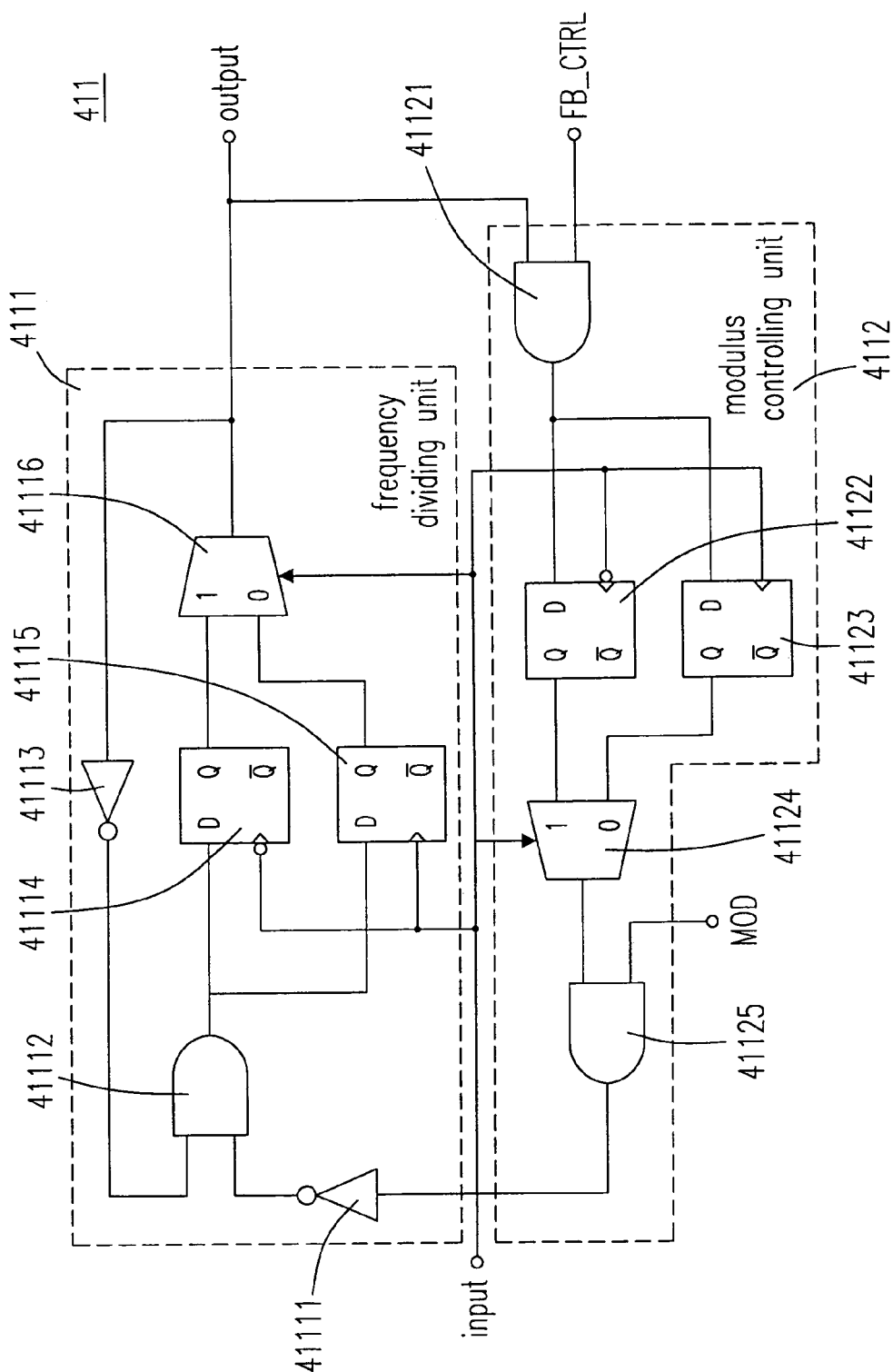
FIG. 5 is the schematic circuit diagram of a 1/1.5 frequency divider according to the first preferred embodiment of the present invention.
Figure 6:
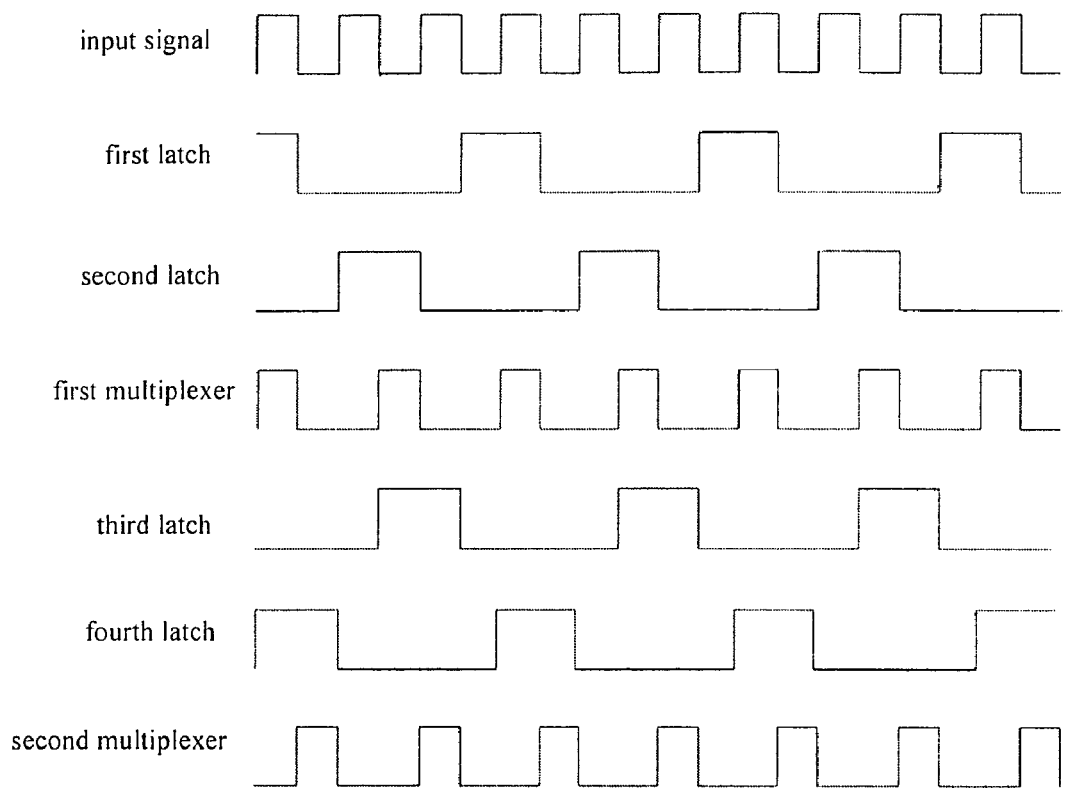
FIG. 6 is the timing chart of the 1/1.5 frequency divider according to the first preferred embodiment of the present invention in the divide-by-1.5 mode.

In which, the controlling method of the provided FFD 411 (as shown in FIG. 5) includes one of the steps of: (a) making one of a first modulus control signal MOD and a first feedback control signal FB_CTRL in a first logic low state so as to generate a first modulus selection signal in the first logic low state in response to a DET of a first input signal such that a generation of a first output signal is not suppressed when the FFD 411 is employed in dividing a frequency of the first input signal by an integer modulus; and (b) making one of a second modulus control signal MOD and a second feedback control signal FB_CTRL in a second logic low state so as to generate a second modulus selection signal in the second logic low state in response to a DET of a second input signal such that a generation of a second output signal is not suppressed for a time period of the second input signal, then making both a third modulus control signal MOD and a third feedback control signal FB_CTRL in a first logic high state so as to generate a third modulus selection signal in the first logic high state such that the generation of the second output signal is suppressed for a half of the time period of the second input signal, and recurring in a cycle thereof when the FFD 411 is employed in dividing a frequency of the second input signal by a fractional modulus.

As for the controlling method of the provided PFFD 41 (as shown in FIG. 7), which generates a first output signal ($F_{OUT}$) through dividing a frequency of an input signal ($F_{IN}$) by one of a plurality of moduli each having a fractional step size (0.5), and includes an FFD 411 generating a second output signal ($F_{OUT1}$) and a divider chain 31 coupled to the FFD 411, including a plurality of IFDs 311, having any two neighboring ones of the plurality of IFDs 311 coupled to each other in series and generating the first output signal ($F_{OUT}$), includes the steps of: (a) making the FFD 411 receive the input signal ($F_{IN}$), one ($MOD_0$) of a plurality of modulus control signals ($MOD_0$ to $MOD_N$) and a feedback control signal of the divider chain 31 ($FB\_CTR_1$) and each of the plurality of IFDs 311 receive one of the plurality of modulus control signals ($MOD_0$ to $MOD_N$) and a feedback control signal of each of the plurality of IFDs 311 (one of $FB\_CTR_2$ to $FB\_CTR_{N+1}$); (b) dividing a frequency of the input signal ($F_{IN}$) by a first integer modulus to generate the second output signal ($F_{OUT1}$) when one of the modulus control signal of the FFD ($MOD_0$) and the feedback control signal of the divider chain 31 ($FB\_CTR_1$) is in a logic low state and dividing the frequency of the input signal ($F_{IN}$) by a fractional modulus to generate the second output signal ($F_{OUT1}$) when one of the modulus control signal of the FFD ($MOD_0$) and the feedback control signal of the divider chain 31 (FB_CTR$_1$) is in a logic low state and to last for a time period of the input signal (F$_{IN}$), then both the modulus control signal of the FFD (MOD$_0$) and the feedback control signal of the divider chain 31 (FB_CTR$_1$) are in a logic high state and to last for half of the time period of the input signal (F$_{IN}$), and a cycle thereof is recurring; (c) dividing a frequency of a respective divider input signal (one of F$_{OUT1}$ to F$_{OUTN}$) of one of the plurality of IFDs 311 by a second integer modulus to generate a respective divider output signal (one of F$_{OUT2}$ to F$_{OUTN}$ and F$_{OUT}$) of one of the plurality of IFDs 311 when one of the modulus control signal (MOD$_0$ to MOD$_N$) and the feedback control signal of one of the plurality of IFDs 311 (one of FB_CTR$_2$ to FB_CTR$_{N+1}$) is in a logic low state; and dividing the frequency of the respective divider input signal (F$_{IN}$) of one of the plurality of IFDs 311 by a third integer modulus to generate the respective divider output signal (one of F$_{OUT2}$ to F$_{OUTN}$ and F$_{OUT}$) of one of the plurality of IFDs 311 when both the modulus control signal (one of MOD$_0$ to MOD$_N$) and the feedback control signal (one of FB_CTR$_2$ to FB_CTR$_{N+1}$) of one of the plurality of IFDs 311 are in a logic high state; and (d) making the PFFD 41 generate the first output signal (F$_{OUT}$) according to the input signal (F$_{IN}$) and one of the plurality of moduli.

Regarding the controlling method of the provided PFFD having an AMR 51 (as shown in FIG. 11), which generates a first output signal (F$_{OUT}$) through dividing a frequency of an input signal (F$_{IN}$) by one of a plurality of moduli each having a fractional step size (0.5), and includes an FFD 411 generating a second output signal (F$_{OUT1}$), a divider chain 31 coupled to the FFD 411, including a plurality of IFDs 311, having any two neighboring ones of the plurality of IFDs 311 coupled to each other in series and generating the first output signal (F$_{OUT}$) and an MRCC 511 (including a plurality of OR gate 5111, a decoder 5112 and a multiplexer 5113) adjusting the AMR formed by the plurality of moduli includes the steps of: (a) making the MRCC 511 generate a control signal (DEC [2:0] generating in response to an external MRCS: MOD_EXT) so as to have one of a turn-on and a turn-off of a feedback control (one of FB_CTR$_2$ to FB_CTR$_{N+1}$) of a specific one of the plurality of IFDs 311 and all other IFDs 311 following the specific IFD 311 to adjust the AMR; (b) making the FFD 411 receive the input signal (F$_{IN}$), one (MOD$_0$) of a plurality of modulus control signals (MOD$_0$ to MOD$_N$) and a feedback control signal of the divider chain 31 (FB_CTR$_1$) and each of the plurality of IFDs 311 receive one of the plurality of modulus control signals (MOD$_0$ to MOD$_N$) and a feedback control signal of each of the plurality of IFDs 311 (one of FB_CTR$_2$ to FB_CTR$_{N+1}$); (c) dividing a frequency of the input signal (F$_{IN}$) by a first integer modulus to generate the second output signal (F$_{OUT1}$) when one of the modulus control signal of the FFD (MOD$_0$) and the feedback control signal of the divider chain 31 (FB_CTR$_1$) is in a logic low state and dividing the frequency of the input signal (F$_{IN}$) by a fractional modulus to generate the second output signal (F$_{OUT1}$) when one of the modulus control signal of the FFD (MOD$_0$) and the feedback control signal of the divider chain 31 (FB_CTR$_1$) is in a logic low state and to last for a time period of the input signal (F$_{IN}$), then both the modulus control signal of the FFD (MOD$_0$) and the feedback control signal of the divider chain 31 (FB_CTR$_1$) are in a logic high state and to last for half of the time period of the input signal (F$_{IN}$), and a cycle thereof is recurring; (d) dividing a frequency of a respective divider input signal (one of F$_{OUT1}$ to F$_{OUTN}$) of one of the plurality of IFDs 311 by a second integer modulus to generate a respective divider output signal (one of F$_{OUT2}$ to F$_{OUTN}$ and F$_{OUT}$) of one of the plurality of IFDs 311 when one of the modulus control signal (MOD$_0$ to MOD$_N$) and the feedback control signal of one of the plurality of IFDs 311 (one of FB_CTR$_2$ to FB_CTR$_{N+1}$) is in a logic low state; and dividing the frequency of the respective divider input signal (F$_{IN}$) of one of the plurality of IFDs 311 by a third integer modulus to generate the respective divider output signal (one of F$_{OUT2}$ to F$_{OUTN}$ and F$_{OUT}$) of one of the plurality of IFDs 311 when both the modulus control signal (one of MOD$_0$ to MOD$_N$) and the feedback control signal (one of FB_CTR$_2$ to FB_CTR$_{N+1}$) of one of the plurality of IFDs 311 are in a logic high state; and (e) making the PFFD 51 generate the first output signal (F$_{OUT}$) according to the input signal (F$_{IN}$) and one of the plurality of moduli.

Furthermore, the controlling method of a FNPLL 4 (as shown in FIGS. 12(a) and 12(b)) includes the steps of: (a) making a VCO 25 receive an input signal and generate an output signal; and (b) making a PFFD 51 receive a feedback signal of the output signal and divide a frequency of the feedback signal by a plurality of moduli having a fractional step size (0.5) so as to generate a frequency divided output signal; (c) making an XO 21 generate a reference signal source REF$_{IN}$; (d) comparing a phase and a frequency of the reference signal source REF$_{IN}$ and a phase and a frequency of the frequency divided output signal by a PFD 22 so as to generate one of a charging and a discharging signals; (e) making a CP 23 generate a charging action while receiving the charging signal to raise an output, current so as to raise the frequency of the frequency divided output signal and generate a discharging action while receiving the discharging signal to lower the output current so as to lower the frequency of the frequency divided output signal; (f) filtering a phase noise of the output current of the CP 23 by a LPF 24 and generating the input signal of the VCO 25 accordingly; (g) making a DSM 32 receive an external input signal and generate a modulated signal; (h) making an adder 33 receive an external integer and the modulated signal, add the external integer and the modulated signal and output a sum thereof to the PFFD 41 so as to generate the plurality of moduli; and (i) making a frequency of the output signal of the VCO 25 stabilize at a product of the frequency of the reference signal source REF$_{IN}$ and a mean value of the plurality of moduli after a plurality of, operations of the FNPLL 4.

Besides, the controlling method of a FNPLL having an AMR 5 (as shown in FIG. 12(c)) includes the steps of: (a) making a VCO 25 receive an input signal and generate an output signal; and (b) making a PFFD having the AMR 51 receive a feedback signal of the output signal and divide a frequency of the feedback signal by a plurality of moduli having a fractional step size (0.5) so as to generate a frequency divided output signal and adjust the AMR according to an MRCS received by the PFFD 51.

Surely, the aforementioned controlling method of the FNPLL having the AMR 5 (as shown in FIG. 12(c)) further includes the above-mentioned step (c) to step (i) of the provided controlling method of the FNPLL 4.

From the above descriptions, the present invention provides the configurations and the controlling methods of an FFD, a PFFD; an FNPLL, a PFFD having an AMR and an FNPLL having an AMR respectively. Relatively, the provided circuits have better modulus resolution so as to generate lower quantization errors and lower phase noises.

Although the invention has been shown and described in terms of specific embodiments it will be evident that changes and modifications are possible which do not in fact depart from the inventive concepts taught herein. It will be appreciated by those skilled in the art that various omissions, additions and modifications may be made to the processes described above without departing from the scope of the invention, and all such modifications and changes are intended to fall within the scope of the invention, as defined in appended claims.

What is claimed is:

1. A fractional frequency divider (FFD), comprising:
   an input terminal receiving an input signal;
   an output terminal outputting an output signal;
   a modulus controlling unit (MCU) having a first dual-edge trigger (FDET), receiving said input signal and generating a modulus selection signal (MSS) in response to said FDET; and
   a frequency dividing unit (FDU) having:
   a first NOT gate having an input and an output terminal;
   a first AND gate having a first terminal, a second terminal coupled to said output terminal of said first NOT gate and an output terminal;
   a second NOT gate having an input terminal coupled to said output terminal of said FFD and receiving a first feedback signal and an output terminal coupled to said first terminal of said first AND gate;
   a second dual-edge trigger (SDET) having:
      a first latch having a first terminal coupled to said output terminal of said first AND gate, a second terminal being an enable terminal, coupled to said input terminal of said FFD and receiving said input signal, and an output terminal; and
      a second latch having a first terminal coupled to said output terminal of said first AND gate, a second terminal coupled to said input terminal of said FFD and receiving said input signal and an output terminal; and
   a first multiplexer having a first terminal coupled to said output terminal of said first latch, a second terminal coupled to said output terminal of said second latch, a third terminal coupled to said input terminal of said FFD and receiving said input signal, and an output terminal coupled to said output terminal of said FFD, coupled to said MCU and dividing a frequency of said input signal by one of an integer and a fractional moduli in response to said SDET and said MSS to generate said output signal via said first multiplexer.

2. The FFD according to claim 1, wherein said MCU and said FDU are triggered by said FDET and said SDET respectively.

3. The FFD according to claim 1, wherein said MSS is in a logic low state and an operation of said FDU is not suppressed when said FFD is in a divided-by-said integer modulus mode, said operation is suppressed when said MSS is in a logic high state, and said operation has a recurring cycle, in which said operation is not suppressed for a time period of said input signal and then suppressed for half of said time period of said input signal, when said FFD is in a divided-by-said fractional modulus mode.

4. The FFD according to claim 3, wherein said MCU further receives a modulus control signal (MCS) and a feedback control signal (FCS), said MSS is in said logic low state when one of said MCS and said FCS is in said logic low state, and said MSS is in said logic high state when said MCS and said FCS are both in said logic high state.

5. The FFD according to claim 4, wherein said integer modulus is 1 and said fractional modulus is 1.5.

6. The FFD according to claim 4, wherein said MCU further comprises:
   a second AND gate having a first terminal coupled to said output terminal of said FFD and receiving a second feedback signal, a second terminal receiving said FCS and an output terminal;
   a third latch having a first terminal coupled to said output terminal of said second AND gate, a second terminal being an enable terminal, coupled to said input terminal of said FFD and receiving said input signal and an output terminal;
   a fourth latch having a first terminal coupled to said output terminal of said second AND gate, a second terminal coupled to said input terminal of said FFD and receiving said input signal and an output terminal;
   a second multiplexer having a first terminal coupled to said output terminal of said third latch, a second terminal coupled to said output terminal of said fourth latch, a third terminal coupled to said input terminal of said FFD and receiving said input signal and an output terminal; and
   a third AND gate having a first terminal coupled to said output terminal of said second multiplexer, a second terminal receiving said MCS and an output terminal coupled to said input terminal of said first NOT gate, wherein said FDET comprises said third and said fourth latches.

7. A controlling method of a fractional frequency divider (FFD), wherein said FFD is an FFD as claimed in claim 1, comprising one of the steps of:
   (a) making one of a first modulus control and a first feedback control signals in a first logic low state so as to generate a first modulus selection signal in said first logic low state in response to said FDET such that a generation of a first output signal is not suppressed when said FFD is employed in dividing a frequency of a first input signal by an integer modulus; and
   (b) making one of a second modulus control and a second feedback control signals in a second logic low state so as to generate a second modulus selection signal in said second logic low state in response to said SDET such that a generation of a second output signal is not suppressed for a time period of a second input signal, then making both a third modulus control and a third feedback control signals in a first logic high state so as to generate a third modulus selection signal in said first logic high state such that said generation of said second output signal is suppressed for a half of said time period of said second input signal, and recurring in a cycle thereof when said FFD is employed in dividing a frequency of said second input signal by a fractional modulus.

8. A fractional frequency divider (FFD) comprising:
   an integer and a fractional moduli;
   a first and second states;
   an input terminal receiving an input signal;
   an output terminal outputting an output signal;
   a modulus controlling unit (MCU) having a first dual-edge trigger (FDET), receiving said input signal and generating a modulus selection signal (MSS) in response to said FDET and one of said first and second states;
   a frequency dividing unit (FDU) having;
   a first NOT gate having an input and an output terminal;
   a first AND gate having a first terminal, a second terminal coupled to said output terminal of said first NOT gate and an output terminal;
   a second NOT gate having an input terminal coupled to said output terminal of said FFD and receiving a first feedback signal and an output terminal coupled to said first terminal of said first AND gate;
   a second dual-edge trigger (SDET) having:
      a first latch having a first terminal coupled to said output terminal of said first AND gate, a second terminal being and enable terminal, coupled to said input terminal of said FFD and receiving said input signal, and an output terminal; and a second latch having a first terminal coupled to said output terminal of said first AND gate, a second terminal coupled to said input terminal of said FFD and receiving said input signal and an output terminal; and a first multiplexer having a first terminal coupled to said output terminal of said first latch, a second terminal coupled to said output terminal of said second latch, a third terminal coupled to said input terminal of said FFD and receiving said input signal and an output terminal coupled to said output terminal of said FFD, coupled to said MCU, and generating said output signal in response to said SDET and said MSS, wherein said frequency of said input signal is divided by said integer modulus and a generation of said output signal is not suppressed when said FFD is in said first state, and said frequency of said input signal is divided by said fractional modulus and said generation has a recurring cycle, in which said generation is not suppressed for a time period of said input signal and then suppressed for half of said time period of said input signal, when said FFD is in said second state.

9. The FFD according to claim 8,
wherein said MSS is in a logic low state when said FFD is in said first state, and said MSS has a recurring cycle, in which said MSS is in a logic low state for a time period of said input signal and then in a logic high state for half of said time period of said input signal, when said FFD is in said second state.

* * * * *